(12) United States Patent
Kimura et al.

(10) Patent No.: US 6,953,268 B2
(45) Date of Patent: Oct. 11, 2005

(54) LIGHT MODULATING DEVICE AND EXPOSURE APPARATUS USING THE SAME

(75) Inventors: Koichi Kimura, Kanagawa (JP); Hiroshi Sunagawa, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/456,950

(22) Filed: Jun. 9, 2003

(65) Prior Publication Data

US 2004/0042213 A1 Mar. 4, 2004

(30) Foreign Application Priority Data

Jun. 7, 2002 (JP) .......................... 2002-167402
May 7, 2003 (JP) .......................... 2003-129108

(51) Int. Cl.[7] .............................. F21V 1/00; G03B 3/00
(52) U.S. Cl. ...................... 362/268; 362/317; 362/253; 353/101; 349/95
(58) Field of Search ................................. 362/317, 268, 362/253, 331; 359/819; 353/100, 101; 349/95

(56) References Cited

U.S. PATENT DOCUMENTS 5,764,318 A * 6/1998 Kurematsu et al. ............ 349/5
6,606,135 B2 * 8/2003 Nakanishi et al. ............ 349/95
6,631,039 B2 * 10/2003 Fujimori et al. ............ 359/819
2001/0015778 A1 * 8/2001 Murade et al. ............... 349/43

FOREIGN PATENT DOCUMENTS

JP   2001-521672   6/2001
WO   WO 98/47042   10/1998

* cited by examiner

Primary Examiner—John Anthony Ward
Assistant Examiner—Bao Q Truong
(74) Attorney, Agent, or Firm—Sughrue Mion, PLLC

(57) ABSTRACT

A light modulating device comprising a plurality of light modulating elements modulating the light that is incident thereto and emitting the light, wherein each of the light modulating elements is formed from a micro electronic machinery which is two-dimensionally arranged, and the transmittance can be controlled so as to vary for each of the light modulating elements. The light modulating device further comprises a lens array on a light-incident side of the light modulating elements, and the lens array condenses the incident light, which impinges on each of the light modulating elements, into a region whose area is smaller than an area occupied by each of the light modulating elements at a light-incident side thereof. Consequently, the light modulating device, in which usability of the light is improved and resolution is increased in the projection exposure, and the exposure apparatus using the same can be obtained.

23 Claims, 17 Drawing Sheets

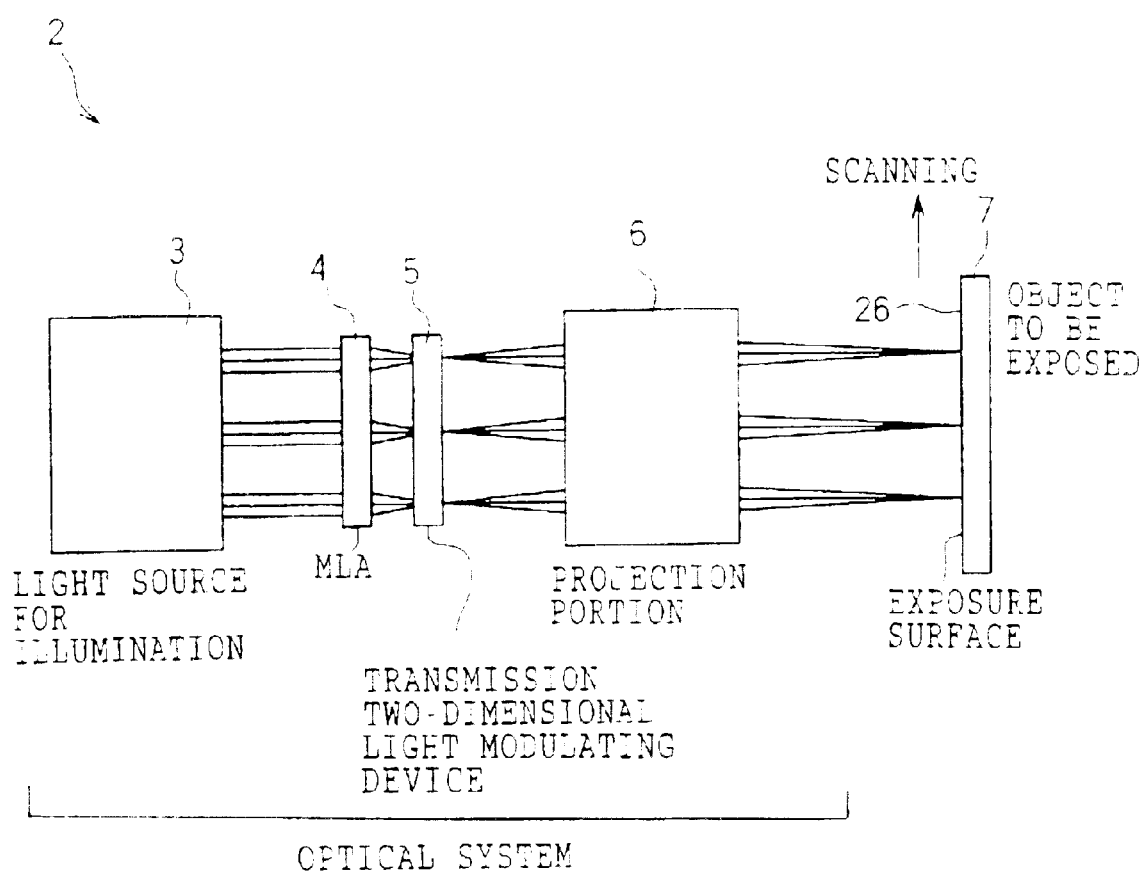

LIGHT MODULATING DEVICE AND EXPOSURE APPARATUS USING THE SAME

CROSS-REFERENCE TO RELATED APPLICATION

This application claims priority under 35USC 119 from Japanese Patent Applications No. 2002-167402 and No. 2003-129108, the disclosure of which is incorporated by reference herein.

BACKGROUND OF THE INVENTION

1. Field of the Invention

The present invention relates to a light modulating device in which a plane-shaped light beam is incident and its transmittance is changed to perform exposure and an exposure apparatus using the same, more specifically relates to the optimum device for a system performing on-demand direct photolithography, particularly it is preferable for the system, which applies projection exposure by using the two-dimensional light modulating device, such as an image forming apparatus and a projector.

2. Description of the Related Art

In recent years, the exposure apparatus for performing the on-demand direct photolithography of a pattern image onto a photosensitive material without using a photomask is expected during a photolithographic process in a pattern formation of an electronic circuit for a circuit board or a display device or the like. Techniques of the related art will be described below showing examples.

As shown in FIG. 19, in WO98/47042 (Japanese Patent Application National Publication No. 2001-521672), a transmission two-dimensional light modulating device 484 is irradiated with a plane-shaped light beam emitted from a light source for illumination 482. The two-dimensional light modulating device 484 controls transmittance of the incident light in each light modulating element according to an image signal, projects the outgoing light on an exposure surface 486, and exposes the exposure surface 486. A liquid crystal device, PLZT, an electro-mechanically driven light modulating device, and the like are used as the above-described transmission two-dimensional light modulating device 484. A reflection type can be also used as the two-dimensional light modulating device, an electro-mechanically driven deflection mirror array device, which is known as a DMD device, can also be used. In this case (not shown), the substantially parallel light emitted from the light source for illumination is incident to the reflection two-dimensional light modulating device, the two-dimensional light modulating device controls a reflection angle of the incident light in each light modulating element according to the image signal, projects the outgoing light on the exposure surface, and exposes the exposure surface. In an embodiment of the related art (Japanese Patent Application National Publication No. 2001-521672), an imaging optical system including a microlens array is provided as a projection exposing system.

When maskless direct photolithographic exposure for the photolithography is considered as an application of the exposure apparatus in the pattern formation of the electronic circuit for the circuit board or the display device, practically since the number of light modulating elements in the two-dimensional light modulating device is smaller than the required number of light modulating elements, the necessary light modulating elements are exposed by scanning an exposure optical system or an object to be exposed.

FIGS. 20A, 20B, 21A, and 21B show features of the related art disclosed in Japanese Patent Application National Publication No. 2001-521672. FIG. 20A shows an arranging direction of the two-dimensional light modulating device in the usual exposure surface, and an example in the case that a column of the two-dimensional light modulating device and a scanning direction are arranged in parallel. In this case, when the exposure scanning is performed along the scanning direction, the light modulating elements are overlapped in the column direction, and resolution perpendicular to the scanning direction is restricted by a pitch of the light modulating element in a row direction of the two-dimensional light modulating device. On the other hand, as shown in FIG. 20B, when the column of the two-dimensional light modulating device is arranged to be oblique relative to the scanning direction, the resolution perpendicular to the scanning direction on the exposure surface is significantly increased by the pitch of the light modulating element in the column direction and an oblique angle. However, as shown in FIG. 20B, when a size of the light modulating element is large, the practical useful resolution is not obtained because spots of the light modulating elements are overlapped on the exposure surface.

In order to make the most of the above-described effect, as shown in FIG. 21A, an opening whose area is smaller than that of the light modulating element is provided for the light modulating element of the two-dimensional light modulating device in the related art. Accordingly, as shown in FIG. 21B, when the column of the two-dimensional light modulating device is arranged to be oblique relative to the scanning direction, the effect in which the resolution perpendicular to the scanning direction on the exposure surface is substantially increased is obtained.

By the way, in the above-described related art, though there is the description in which the opening is provided in the light modulating element of the two-dimensional light modulating device, no concrete structure is shown. Supposing that the structure of the related art is the structure which is usually thought, a problem will be described below.

For example, FIG. 22 is an explanatory view in the case that a shielding portion is simply formed in the light modulating element of the two-dimensional light modulating device to provide the opening. The liquid crystal device is shown as the transmission two-dimensional light modulating device. Though the details are omitted, a first transparent substrate 504 is bonded to a second transparent substrate 514 via a spacer 506. Liquid crystal 508 is sealed between these substrates. The light modulating element is usually determined by a light-modulating element electrode (not shown) arranged in the form of a matrix. At this point, since the above-described opening 510 is provided, when a shielding film 512 is formed on the first transparent substrate 504, the incident light is shielded in the region except the opening 510, and the problem in which usability of the light is decreased occurs (even if the shielding film 512 is formed on the second transparent substrate 514, the same problem occurs).

When a liquid crystal device is used as the transmission two-dimensional light modulating device, disadvantage is generated in high-speed response.

When an electro-optic crystal such as PLZT is used as the two-dimensional light modulating device, while two-dimensionability or low-voltage drive became difficult, there is a limit to a kind of light source, and it is impossible to optionally select the kind of light source in the wide range from UV light to infrared light.

Further, when a reflection DMD device is used as the two-dimensional light modulating device, an optical system became complicated and it is disadvantageous that manufacturing cost is increased.

SUMMARY OF THE INVENTION

In view of the foregoing circumstance, it is a first object of the present invention to obtain the light modulating device, in which usability of the light is improved and resolution is increased in the projection exposure, and the exposure apparatus using the same.

Further, it is a second object of the invention to obtain the transmission two-dimensional light modulating device, in which the high-speed response is realized, the two-dimensionability is easily achieved, low-voltage drive can be realized, in addition, the optical system is simple, and the low-cost is achieved, and the exposure apparatus using the same.

The light modulating device according to the first aspect of the invention includes a plurality of light modulating elements modulating the light that is incident thereto and emitting the light, wherein each of the light modulating elements is formed from a micro electronic machinery which is two-dimensionally arranged, and the transmittance can be controlled so as to vary for each of the light modulating elements; and the light modulating device further comprises a lens array on a light-incident side of the light modulating elements, and the lens array condenses the incident light, which impinges on each of the light modulating elements, into a region whose area is smaller than an area occupied by each of the light modulating elements at a light-incident side thereof.

Due to the above-described structure of the invention, condensing effect of the lens array improves the usability of the light and the resolution is improved in the projection exposure by forming the substantial light-modulating-element size smaller than the light-modulating-element region. By using the micro electro-mechanical transmission two-dimensional light modulating device, the high-speed response can be achieved, two-dimensionability can be easily realized, the low-voltage drive can be realized, the optical system can be simplified, and low-cost can be achieved. Further, since the micro electro-mechanical transmission two-dimensional light modulating device is used, selection of the material can correspond to the light source of the wide range from the UV light to the infrared light.

The exposure apparatus according to the second aspect of the invention includes a light source which emits light; an object to be exposed, which is relatively moved in a predetermined direction with respect to the light source; and an optical system which projects the light from the light source onto the object to be exposed, the optical system comprising a light modulating device, wherein the light modulating device comprises a plurality of light modulating elements modulating the light incident thereto and emitting the light, each of the light modulating elements is formed from a micro electronic machinery, which is two-dimensionally arranged, and transmittance can be controlled so as to vary for each of the light modulating elements, the light modulating device further comprises a lens array on a light-incident side of the light modulating elements and the lens array condenses the incident light, which impinges on each of the light modulating elements at a light-incident side thereof, into a region whose area is smaller than the area occupied by each of the light modulating elements, wherein projection light of the optical system is projected while being relatively moved in a scanning direction with respect to an object to be exposed, and a column of the light modulating device is arranged to be oblique relative to the scanning direction.

As described above, when the direction in which the plurality of light modulating elements are arrayed is oblique to the predetermined direction, there is obtained the effect that the resolution in the direction perpendicular to the moving direction on the projection surface is substantially increased by the pitch and the oblique angle of the element in the column direction and the usability of the incident light is improved in a manner that has the lens array in which the light from the light source is condensed in the region where the area is smaller than the region occupied by the light modulating element to impinge on each light modulating element corresponding to the light modulating element of the incident side of the two-dimensional light modulating device.

The exposure apparatus according to the third aspect of the invention includes a light source which emits light; an object to be exposed, which is relatively moved in a predetermined direction with respect to the light source; and an optical system which projects the light from the light source onto the object to be exposed, wherein the optical system comprises a two-dimensional light modulating device which has a plurality of light modulating elements modulating the light incident thereto, is provided on an optical path from the light source toward the object to be exposed, and modulates the incident light for each of the plurality of light modulating elements to output the light, a direction in which the plurality of light modulating elements are arrayed being oblique to the predetermined direction, and a lens array which is arranged on a light-incident side of the two-dimensional light modulating device so as to correspond to the plurality of light modulating elements condenses the light from the light source into a region whose area is smaller than an area occupied by the light modulating element and causes the light to impinge on each of the light modulating elements.

As described above, when the direction in which the plurality of light modulating elements are arrayed is oblique to the predetermined direction, there is obtained the effect that the resolution in the direction perpendicular to the moving direction on the projection surface is substantially increased by the pitch and the oblique angle of the element in the column direction and the usability of the incident light is improved in a manner that has the lens array in which the light from the light source is condensed in the region where the area is smaller than the region occupied by the light modulating element to impinge on each light modulating element corresponding to the light modulating element of the incident side of the two-dimensional light modulating device.

BRIEF DESCRIPTION OF THE DRAWINGS

FIG. 1 is a block diagram showing the whole of exposure apparatus of a first embodiment.

DETAILED DESCRIPTION OF THE INVENTION

Figure 2A:
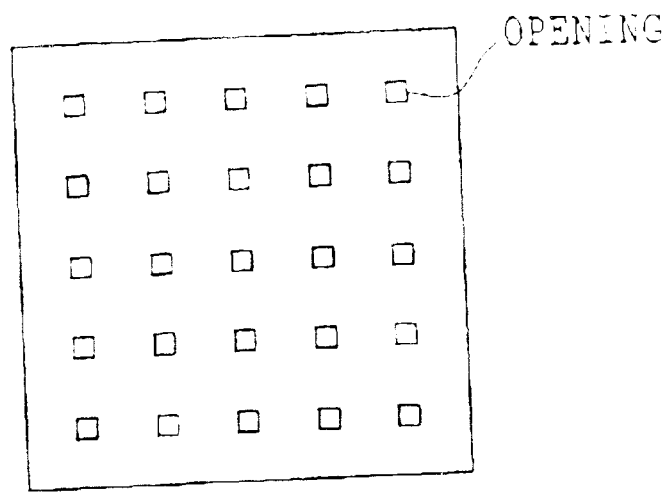
FIGS. 2A and 2B are plan views showing a locus of the scanning light beam in the case that the transmission two-dimensional light modulating device is arranged so that a column direction of each light modulating element is parallel to the scanning direction (showing a state of temporary arrangement), and a locus of the scanning light beam in the case that the transmission two-dimensional light modulating device is arranged so that the column direction of each light modulating element is oblique to the scanning direction (showing the arrangement state in the second embodiment) respectively.

Embodiments of the present invention will be described below.

[First Embodiment]

Initially a first embodiment will be described. FIG. 1 shows the whole of exposure apparatus of the first embodiment. In an exposure apparatus 2 of the first embodiment, a plane-shaped light beam emitted from a light source for illumination 3 is incident to a microlens array (hereinafter referred to as MLA) 4, and a transmission two-dimensional light modulating device 5 is irradiated with the light beam condensed with MLA 4. Each microlens in MLA corresponds to each light modulating element in the two-dimensional light modulating device 5, and the microlens is designed and adjusted so that an optical axis and a focal point of the microlens are in alignment with the center of the light modulating element of the light modulating element. The microlens array 4 corresponds to the lens array described in the mode of the invention. A light modulating element is provided corresponding to a pixel of an image to be recorded.

The incident light from the light source for illumination 3 is condensed with MLA 4 into a smaller area than that of the light modulating element of the two-dimensional light modulating device 5, and guided to the two-dimensional light modulating device 5. The two-dimensional light modulating device 5 controls transmittance of the incident light in each light modulating element according to the image signal, and a projection portion 6 projects the outgoing light on an exposure surface 26 and exposes the exposure surface 26 of an object to be exposed 7. While the projection light is moved in the scanning direction relative to the object to be exposed 7, the projection light is projected and the object to be exposed 7 is exposed, so that the large area can be exposed with high resolution.

Figure 2B:
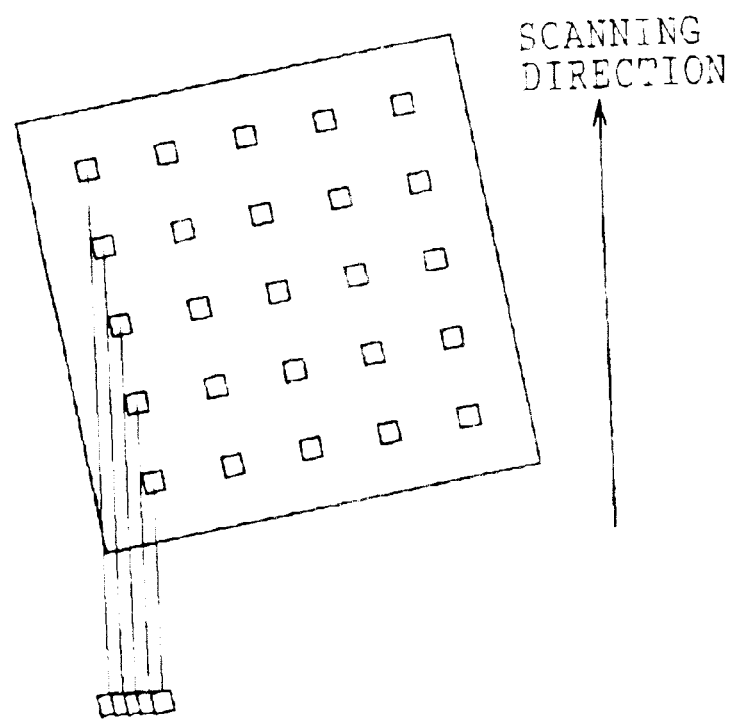

At this point, as shown in FIG. 2B, when the column direction of the two-dimensional light modulating device 5 is arranged to be oblique to the scanning direction, the resolution in the direction perpendicular to the scanning direction is substantially increased in the exposure surface 26 by a pitch of the light modulating elements in the column direction and an oblique angle. In particular, since the incident light is condensed and modulated with MLA 4 into the smaller area than that of the light modulating element of the two-dimensional light modulating device 5, the area of a condensed portion shown in FIG. 2B is properly contracted, which allows a substantial increase in the resolution at the exposure surface 26 where the incident light is projected.

Further, since the light beam is condensed with MLA, usability of the light beam can be improved.

The light source for illumination 3 includes the light source such as a laser or a short arc lamp such as a high-pressure mercury lamp and a xenon lamp, and an optical system which preferably converts the light beam emitted from the light source to the substantially parallel, plane-shaped light beam. The light beam is incident to the transmission two-dimensional light modulating device 5. More preferably, the substantially parallel, plane-shaped light beam may have the optical system which controls an energy distribution to uniform the light beam in the radiation surface.

The shape of the lens surface of the microlens is not limited to a spherical surface, a semi-spherical surface, and the like. The shape of the lens surface of the microlens may be either a convex surface or a concave surface. The flat-shaped microlens array having a refractive index profile may be also applicable, and it may be applicable that diffraction lens such as a Fresnel lens and a binary optics is arrayed.

MLA is made of, for example, transparent glass or resin. From a point of view of mass-productivity, the resin is superior to the glass. On the other hand, from a point of view of life and reliability, the glass is superior to the resin. From a point of view of the optics, quartz glass, fused silica, no alkali glass, and the like are preferable as the glass, and acrylic, epoxy, polyester, polycarbonate, styrene, vinyl chloride and the like are preferable as the resin. There are photo-setting resin, thermoplastic resin, and the like. It is preferable to properly select the kind of resin according to the manufacturing method of the microlens.

A cast forming method with a metallic mold, a pressing method, an injection molding method, a printing method, the photolithography, and the like are practical for the manufacturing method of MLA. In particular with reference to the manufacturing method in which MLA can be formed finely and precisely and the productivity is good, when the microlens is formed with the material of resin, the metallic molding method with the photo-setting (ultraviolet ray) resin or the photolithography with a positive type of resist material or a negative type resist material is preferable, when the glass microlens array is formed, a resist transfer method by RIE (reactive ion etching), an isotropic etching method, or an ion exchange method is preferable.

When the microlens array is formed by the metallic molding method, for example the thermoplastic resin is hot-pressed with the microlens-shaped metallic mold. In order to perform the finer molding, it is preferable that the metallic mold is filled with the photo-setting resin or the thermoplastic resin and pressed, the resin is cured with light or heat, and then the resin is removed from the metallic mold. Accordingly, the finer molding can be performed. In particular, when the finer, high accuracy is required, it is preferable to use the photo-setting resin in which expansion and shrinkage are less occurable by the heat.

When the microlens array made of resin is formed by the photolithography, for example the exposure is properly performed with the ultraviolet ray (or by visible light) properly through a shielding mask in which patterning is made in photo-solution resin or the photo-setting resin represented by the transparent photoresist, and the microlens array is formed by respectively dissolving and developing an exposed portion or a non-exposed portion. Consequently, the microlens having the desired shape can be obtained by the resin material and the distribution of the exposure. Depending on the resin material, by performing high-humid baking processing after the development, the microlens array having the desired shape can be obtained by surface extension during thermal softening.

When the microlens array made of glass is formed by the photolithography, for example light modulating element is formed, and the microlens array is formed by etching a transparent substrate which can transmit the incident light from the above-described light source. In the etching, when a coating film is applied in the shape corresponding to the microlens array, it is easy to form in the desired shape.

[Second Embodiment]

Figure 3:
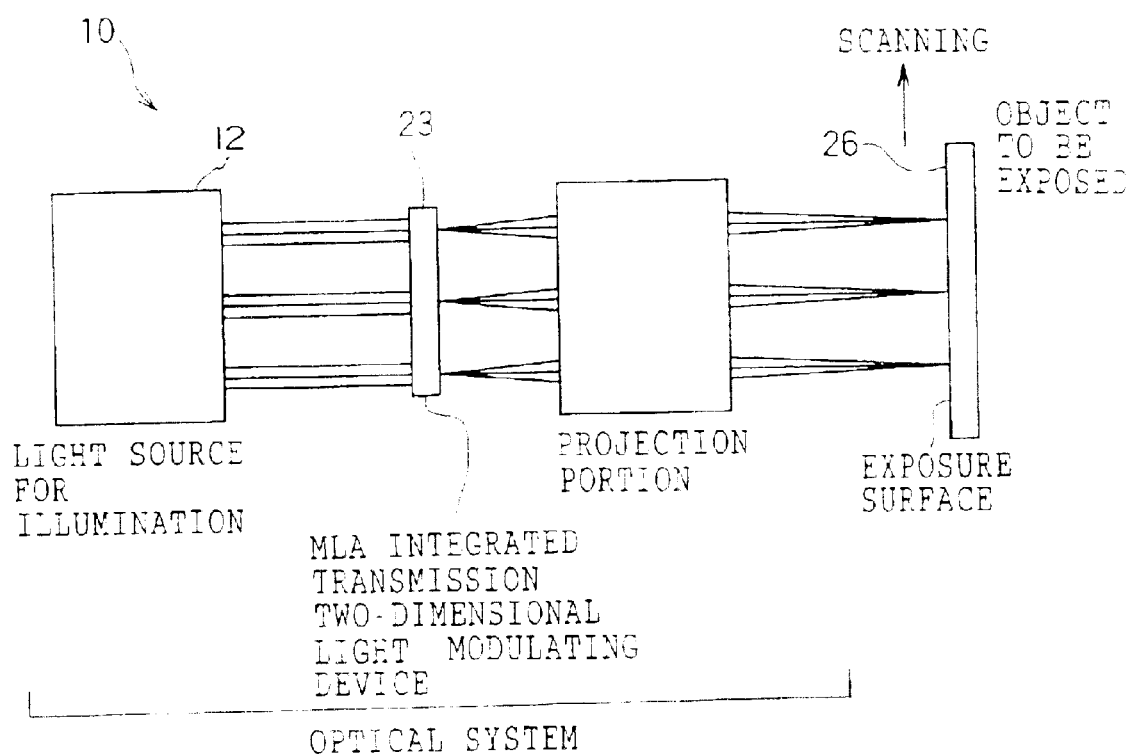
FIG. 3 is a block diagram showing the whole of exposure apparatus of a second embodiment.

A second embodiment will be described below. In the second embodiment, the same components as those of the first embodiment are indicated by the same reference numerals and the description is omitted. As shown in FIG. 3, an exposure apparatus 10 described in the second embodiment includes a light modulating portion 23 in which MLA and the light modulating element are integrated.

Therefore, it is not necessary to adjust the positioning of MLA and the two-dimensional light modulating device, and cost reduction can be achieved because tolerances of the optical accuracy of MLA and the dimensional accuracy of the pattern of the two-dimensional light modulating device are increased. Since the relative positional accuracy between MLA and the two-dimensional light modulating device is improved, the incident light can be efficiently condensed into the light modulating element and the usability of the light can be also improved. Further, since the relative positional accuracy between MLA and the two-dimensional light modulating device is improved, the condensing area can be decreased without decreasing the usability of the light and the resolution can be increased on the exposure surface 26.

[Structure of Light Modulating Portion (Structure of Microlens Array Integrated Type of Light Modulating Device)]

Figure 4:
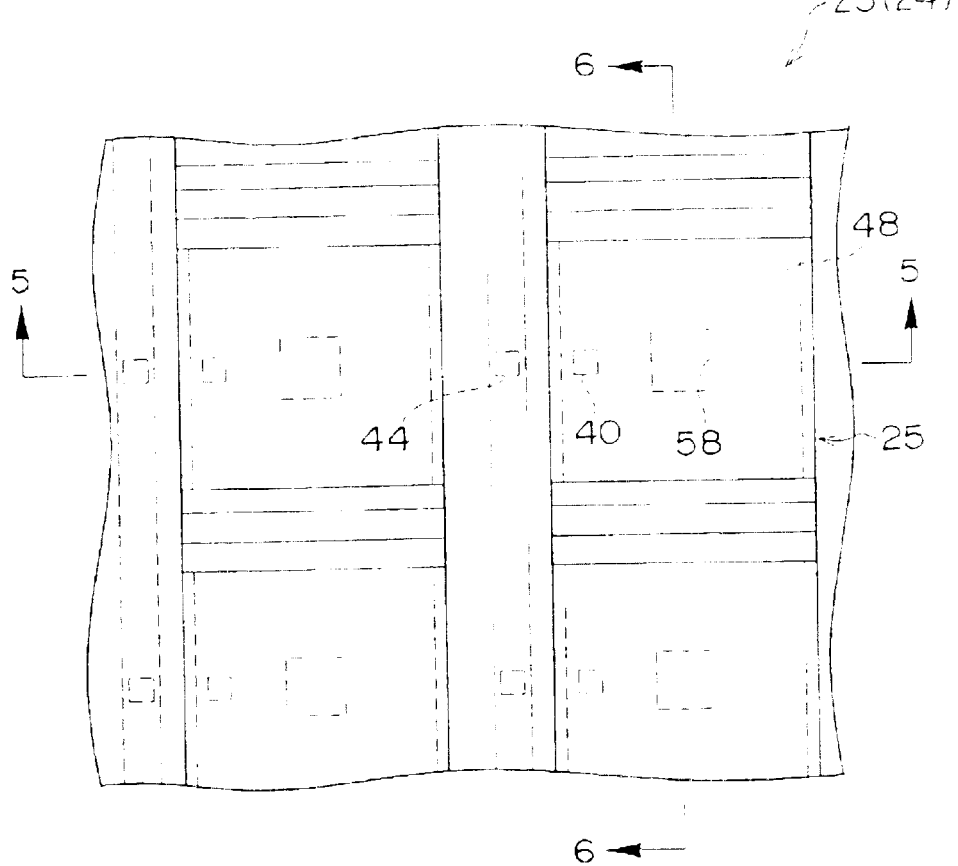
FIG. 4 is a partially expanded plan view of the transmission two-dimensional light modulating device built in the exposure apparatus of the second embodiment.
Figure 5:
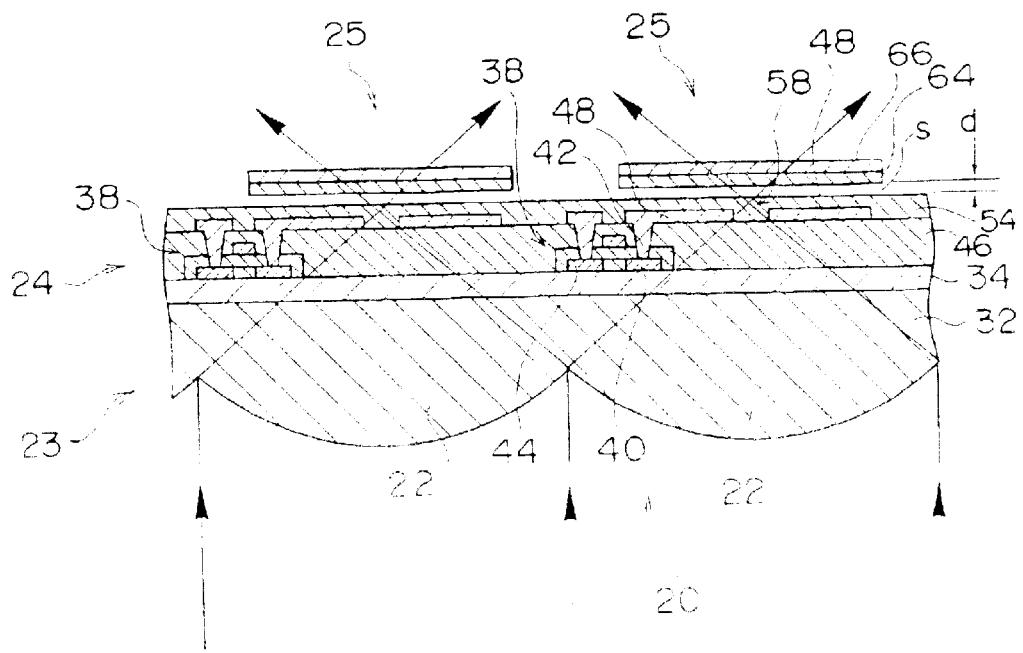
FIG. 5 is a partially expanded sectional side view taken on line 5—5 of FIG. 4.
Figure 6:
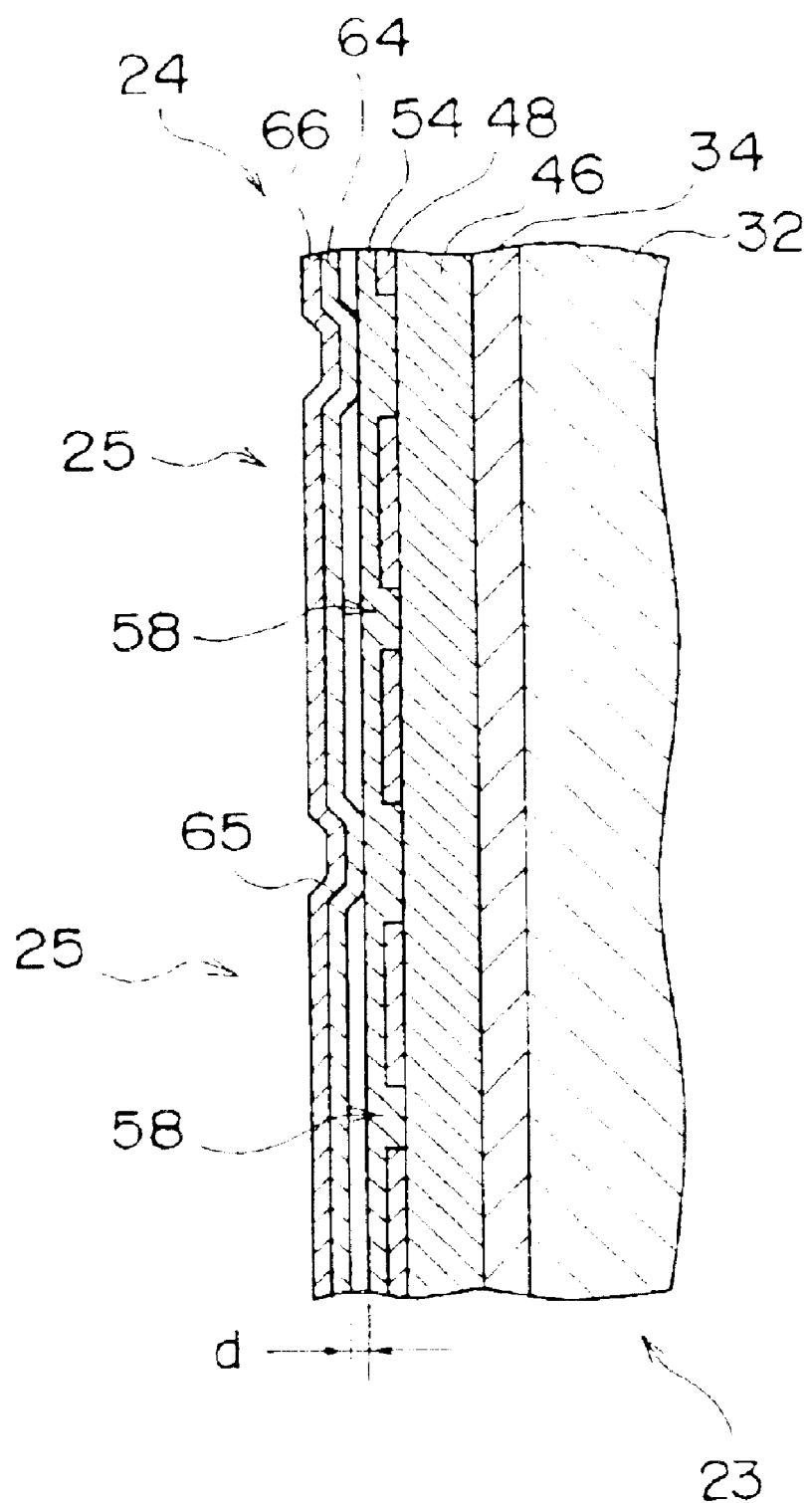
FIG. 6 is a partially expanded sectional side view taken on line 6—6 of FIG. 4.

As shown in FIGS. 4 to 6, in the light modulating portion 23, MLA 20 in which microlenses 22 are two-dimensionally arrayed is integrally formed onto the light-incident side of a two-dimensional light modulating device 24. As described above, electro-mechanical elements 25 are two-dimensionally arrayed in the two-dimensional light modulating device 24.

Figure 7:
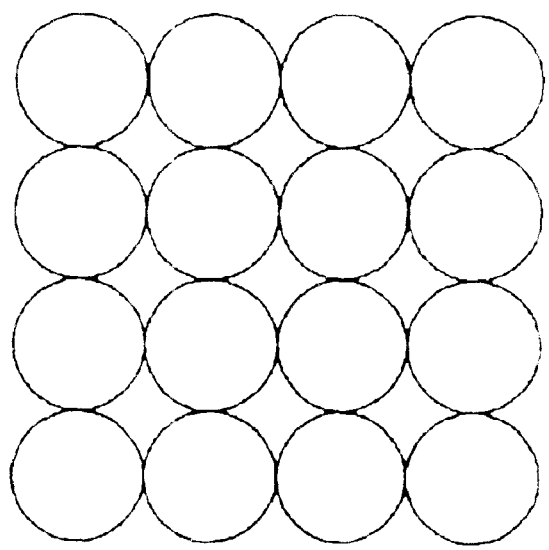
FIG. 7 is a partially expanded view of the microlens array as seen from the light-incident side and a pattern diagram showing an example of the microlens array.
Figure 8:
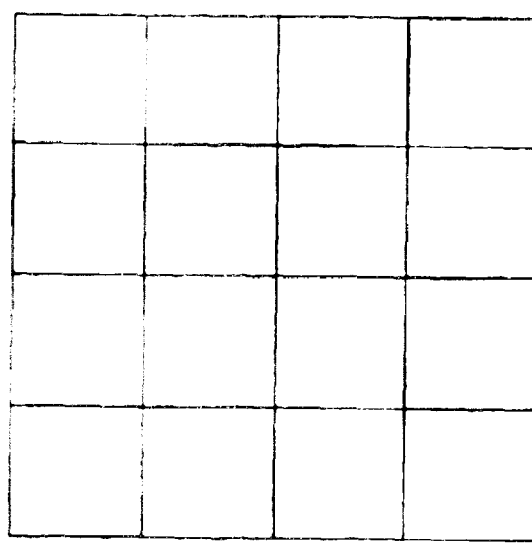
FIG. 8 is a partially expanded view of the microlens array as seen from the light-incident side and a pattern diagram showing an example of the microlens array.
Figure 9:
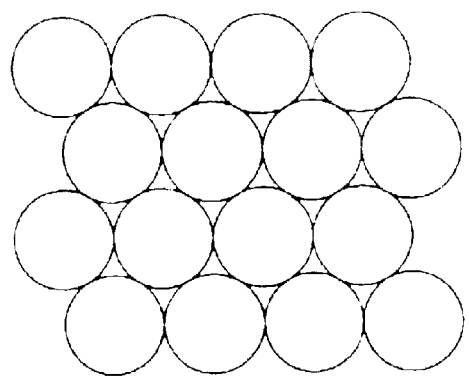
FIG. 9 is a partially expanded view of the microlens array as seen from the light-incident side and a pattern diagram showing an example of the microlens array.
Figure 10:
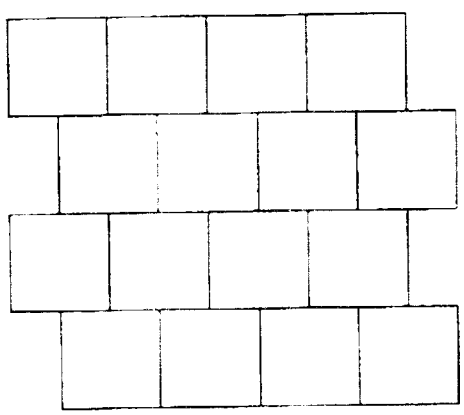
FIG. 10 is a partially expanded view of the microlens array as seen from the light-incident side and a pattern diagram showing an example of the microlens array.
Figure 11:
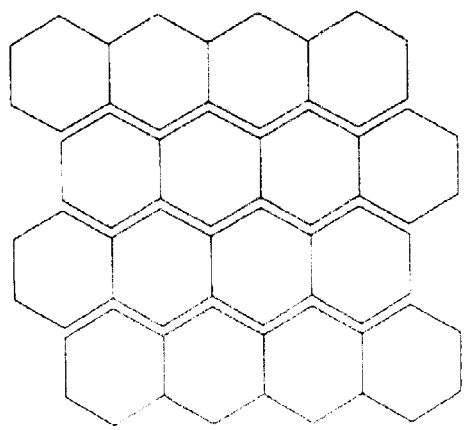
FIG. 11 is a partially expanded view of the microlens array as seen from the light-incident side and a pattern diagram showing an example of the microlens array.

The shape of the microlens 22 viewed from the light-incident side may be a circle (its diameter often ranges from 5 $\mu$m to 100 $\mu$m) or a quadrangle (see FIGS. 7 and 8), or the shape of the microlens 22 can also be other polygonal shapes except the circle and the quadrangle. The state of the array of MLA can be in the form of a stripe, a mosaic, or a honeycomb by changing the forming position of each light modulating element in the two-dimensional light modulating device 24 (see FIGS. 9 to 11).

The light modulating portion 23 includes a transparent glass substrate 32 in which MLA 20 is integrally formed, and a base insulating film 34 formed on the upper side (outgoing-light side) of MLA 20. General MOSFET 38 is formed on the outgoing-light side of the base insulating film 34, and the two-dimensional light modulating device 24 is a so-called active matrix.

MOSFET 38 is covered with a transparent first insulating film 46 such as an $SiO_2$ film or an $SiN_x$ film.

An electrically conductive metal film 48 is formed on the outgoing-light side of the first insulating film 46, and the metal film 48 is electrically connected to a drain 40 of MOSFET 38 through a connecting plug 42. The outgoing-light side of the metal film 48 is covered with a transparent second insulating film 54. It is also possible to form the structure in which the metal film 48 is connected to not the drain 40 but a source 44.

An opening 58 is formed in the center of the metal film 48 while the dimension of the opening 58 is smaller than the pitch of the light modulating element (the pitch often ranges from 10 $\mu$m to 30 $\mu$m), the light condensed with MLA 20 is adapted to pass through the opening 58, and the opening 58 has a function as an aperture.

A third insulating film 64 is provided on the outgoing-light side of the second insulating film 54 so that a gap-shaped space S is formed with predetermined distance d. The distance d between the second insulating film 54 and the third insulating film 64 is often set to a quarter of a wavelength of a laser beam which is irradiated from the light-incident side.

Further, a transparent electrode film 66 such as an ITO film is formed on outgoing-light side of the third insulating film 64, attracting force between the transparent electrode film 66 and the metal film 48 is adjusted by adjusting applied voltage between the transparent electrode film 66 and the metal film 48. Consequently, the distance d can be adjusted, and the two-dimensional light modulating device 24 has a so-called etalon structure.

The second insulating film 54 and the third insulating film 64 function as a half-mirror layer, and the half-mirror is usually formed with a multi-layered film including a high refractive index material and a low refractive index material. The half-mirror is made of a thin film such as the insulating film, semiconductor, and metal. Concretely a dielectric multi-layered film made of $TiO_2/SiO_2$ is typical. It is preferable to properly select the material according to the wavelength of the light which passes through the opening 58 of the two-dimensional light modulating device 24.

When visible light and infrared light are passed through, $TiO_2$, $CeO_2$, $Ta_2O_5$, $ZrO_2$, $Sb_2O_3$, $HfO_2$, $La_2O_3$, $NdO_3$, $Y_2O_3$, $ZnO$, $NbO_5$, and the like are preferable as the material having the high refractive index (the material having the refractive index is approximately equal to or more than 1.8). $MgO$, $Al_2O_3$, $CeF_3$, $LaF_3$, $NdF_3$, and the like are preferable as the material having the relatively high refractive index (the material having the refractive index of approximately 1.6 to 1.8). $SiO_2$, $AlF_3$, $MgF_2$, $Na_3AlF_6$, $NaF$, $LiF$, $CaF_2$, $BaF_2$, and the like are preferable as the material having the low refractive index (the material having the refractive index is approximately equal to or less than 1.5).

When the ultraviolet light (the light having a wavelength ranging from 360 nm to 400 nm) is passed through, $ZrO_2$, $HfO_2$, $La_2O_3$, $NdO_3$, $Y_2O_3$, $TiO_2$, $Ta_2O_6$, and the like are preferable as the material having the high refractive index (the material having the refractive index approximately equal to or more than 1.8). $MgO$, $Al_2O_3$, $LaF_3$, $NdF_3$, and the like are preferable as the material having the relatively high refractive index (the material having the refractive index of approximately 1.6 to 1.8). $SiO_2$, $AlF_3$, $MgF_2$, $Na_3AlF_6$, $NaF$, $LiF$, $CaF_2$, and the like are preferable as the material having the low refractive index (the material having the refractive index approximately equal to or less than 1.5).

A supporting portion 65 abutting on the second insulating film 54 is formed in the third insulating film 64. When the distance d is changed by the voltage applied between the metal film 48 and the transparent electrode film 66, the shape and the dimension of the supporting portion 65 are previously set so as not to break the third insulating film 64 pressed with the transparent electrode film 66.

[Manufacturing Method of Light Modulating Portion]

Figure 14:
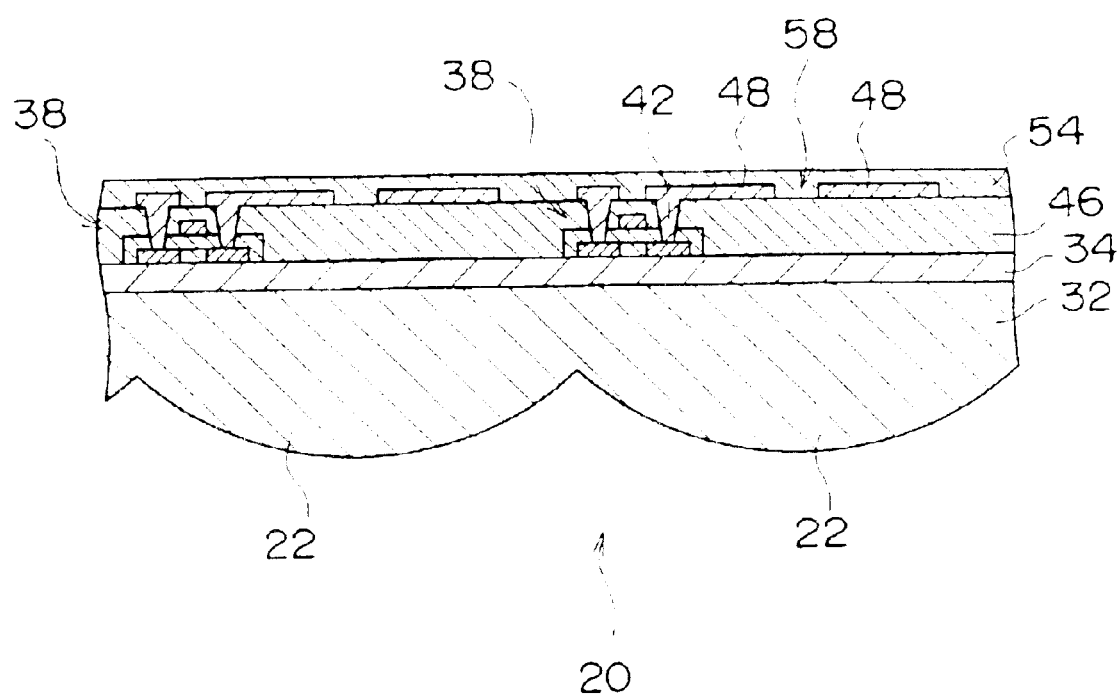
FIG. 14 is a partially expanded sectional side view showing the manufacturing process of the transmission two-dimensional light modulating device built in the exposure apparatus of the second embodiment.

At first a usual MOSFET forming process is performed by using SOI (silicon on insulator) in which the base insulating film 34 and a crystalline silicon layer are provided on the glass substrate 32, MOSFET 38 is formed on the outgoing-light side of the transparent glass substrate 32. The first insulating film 46 is formed, the connecting plug 42 and the metal film 48 are formed, and then the opening 58 is formed (see FIG. 14).

Then, the second insulating film 54 is formed, the resist film (not shown) having a film thickness corresponding to the distance d is applied, and the third insulating film 64 and the transparent electrode film 66 are formed in order.

Figure 12:
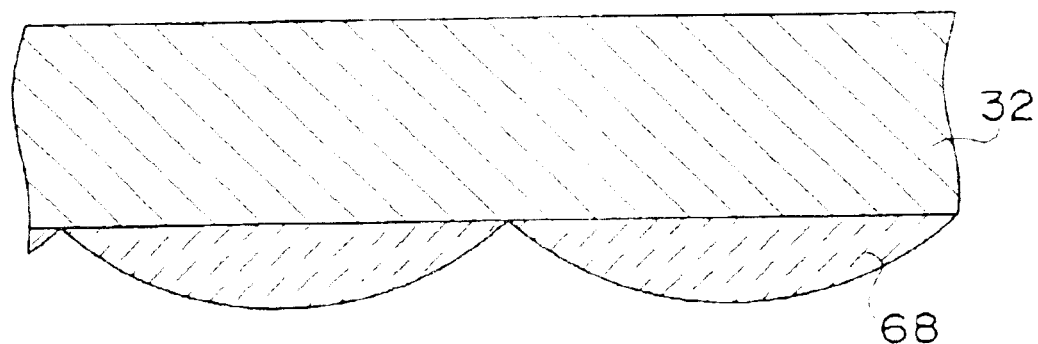
FIG. 12 is a partially expanded sectional side view showing a manufacturing process of the transmission two-dimensional light modulating device built in the exposure apparatus of the second embodiment.

MLA is formed on the light-incident side (surface opposite to MOSFET) of the glass substrate 32. As shown in FIG. 12, fitting to the shape of MLA 20, a resist layer 68 is formed on the light-incident side of the transparent glass substrate 32.

Figure 13:
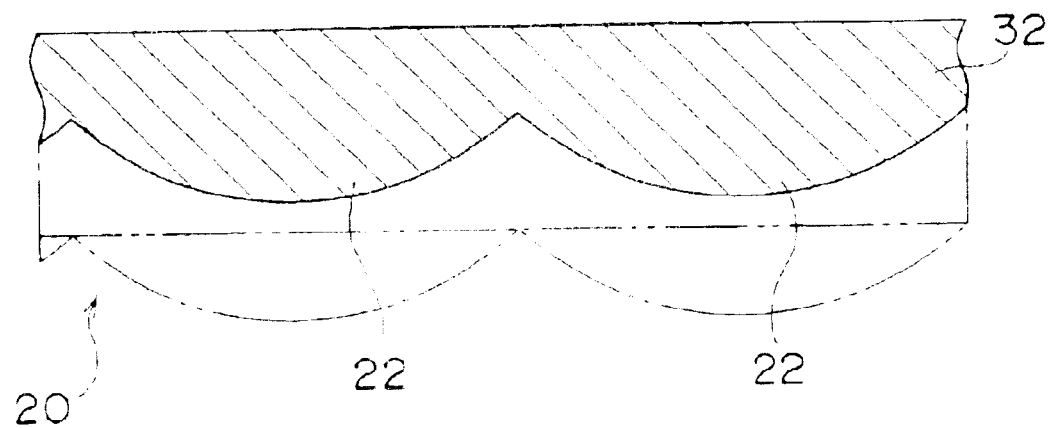
FIG. 13 is a partially expanded sectional side view showing the manufacturing process of the transmission two-dimensional light modulating device built in the exposure apparatus of the second embodiment.

As shown in FIG. 13, the reactive ion etching is performed from the light-incident side. As a result, the transparent glass substrate 32 is etched according to the thickness of the resist layer and MLA 20 is formed.

Finally the gap-shaped space S is formed in such a manner that the resist film is removed by the etching with an organic solvent or oxygen plasma etching (see FIGS. 5 and 6).

As described above, MLA 20 is integrally formed with the transparent glass substrate 32 and the distance between MLA 20 and the opening 58 is significantly decreased. Accordingly, even if the dimensional accuracy is not highly increased, the laser beam transmitted through MLA 20 can be easily taken from the opening 58 and MLA can sufficiently fulfill its function, so that the manufacture of MLA 20 becomes remarkably easy. Further, even if the region cutting off the light is formed inside the two-dimensional light modulating device 24 like the MOSFET 38, the laser beam entering from the light-incident side of the two-dimensional light modulating device 24 can be completely transmitted to the outgoing-light side.

MLA may be previously produced as an MLA substrate, and the MLA substrate may be bonded to an SLM element. The method for integrally making MLA is not limited to the above-described way.

Operation of the exposure apparatus 10 will be described below.

When the light source for illumination 12 emits the laser beams having a given wavelength, the laser beams reaching the light modulating portion 23 are condensed with each of microlens 22 of MLA 20 respectively, and pass through the opening 58.

The laser beam passes through the first insulating film 46 and the second insulating film 54, and outgoing laser beam from the second insulating film 54 reaches the third insulating film 64. At this point, the transmission and the shielding (non-transmission) of the laser beam can be switched at high speed in a manner that changes the distance d by adjusting the voltage applied between the metal film 48 and the transparent electrode film 66. Accordingly, when the scanning surface is scanned with the laser beam transmitted through the two-dimensional light modulating device 24, the transmission and the shielding of the scanning light can be switched at high speed and the fine exposure image can be obtained at high speed.

As described above, in the second embodiment, the exposure apparatus 10 has the light modulating portion 23 including the two-dimensional light modulating device 24 in which the electro-mechanical elements 25 are two-dimensionally arrayed and MLA 20 which is integrally formed with the two-dimensional light modulating device 24.

Consequently, when the exposure apparatus 10 is assembled, the alignment of MLA is not required, so that the manufacture of exposure apparatus 10 can be remarkably facilitated. Since the displacement of MLA 20 never occurs during the operation of the exposure apparatus 10, frequency of problem caused in the operation of the exposure apparatus 10 can be largely decreased. Further, the space for setting MLA 20 is remarkably reduced, which contributes to miniaturization of the exposure apparatus.

Though the case in which the exposure apparatus 10 emits the laser beam was described in the embodiment, even if the exposure apparatus has the structure using an illuminating optical system (for example, discharge lamp) in which the laser beam is not emitted, it is clear that the same effect and advantage as those of the embodiment are obtained.

The active matrix type of two-dimensional light modulating device was described, however, in the same way, a so-called passive matrix type in which an active element is not used can also switch the transmission and the shielding of the laser beam at high speed by giving memory characteristics which utilize hysteresis characteristics of voltage-displacement of the micro electro-mechanical light modulating element driven by the above-described static electricity.

[Third Embodiment]

Figure 15:
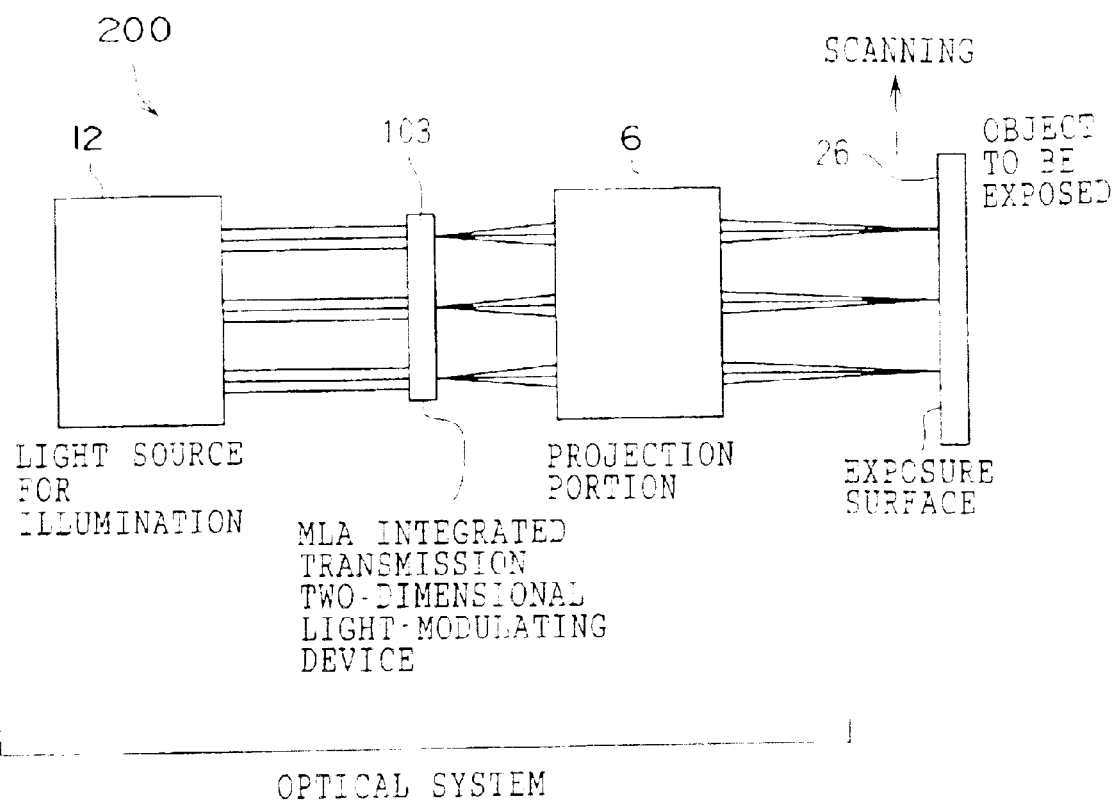
FIG. 15 is a block diagram showing the whole exposure apparatus of a third embodiment.
Figure 16:
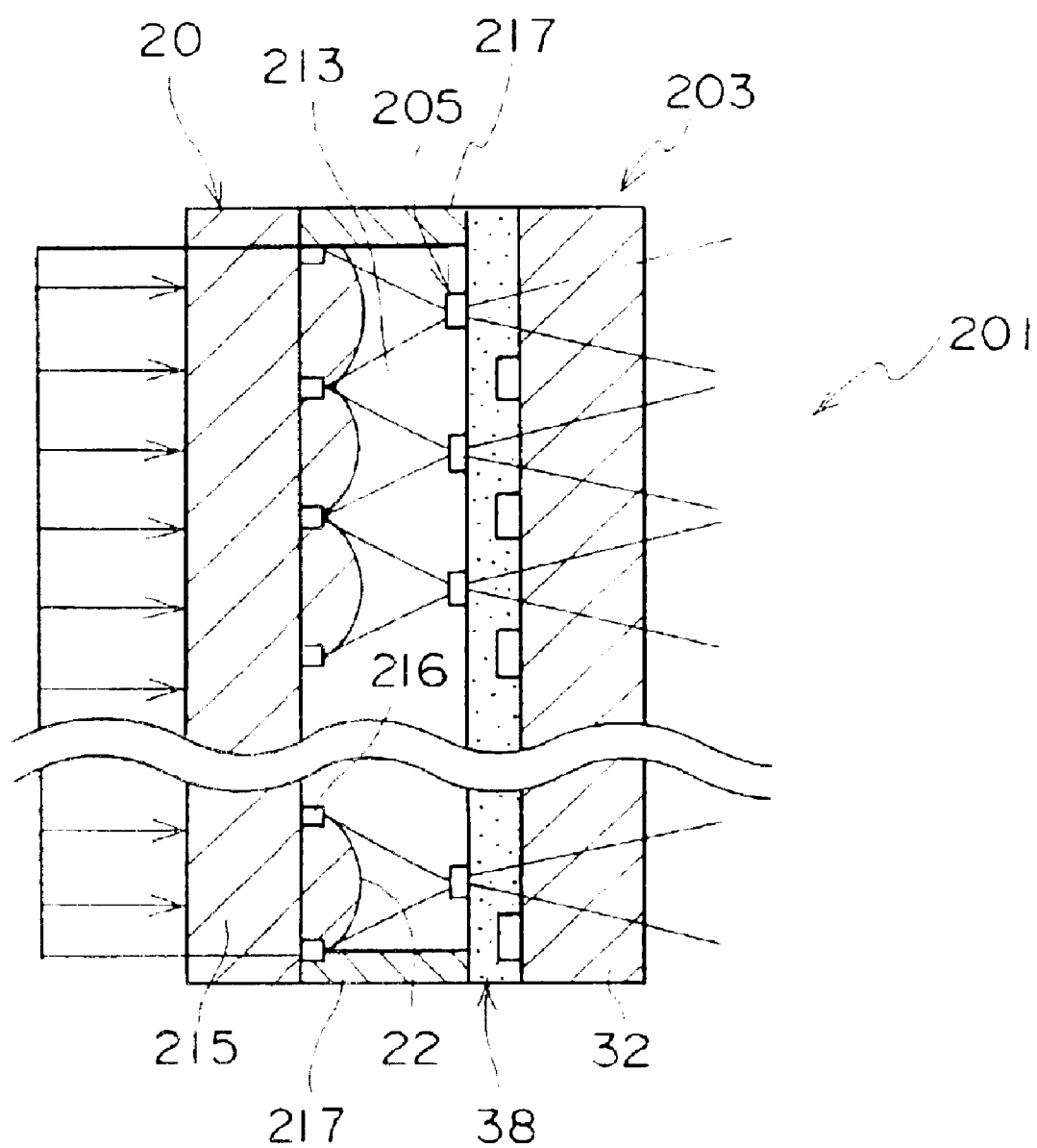
FIG. 16 is a sectional view of a transmission two-dimensional light modulating device built in the exposure apparatus of the third embodiment.
Figure 17:
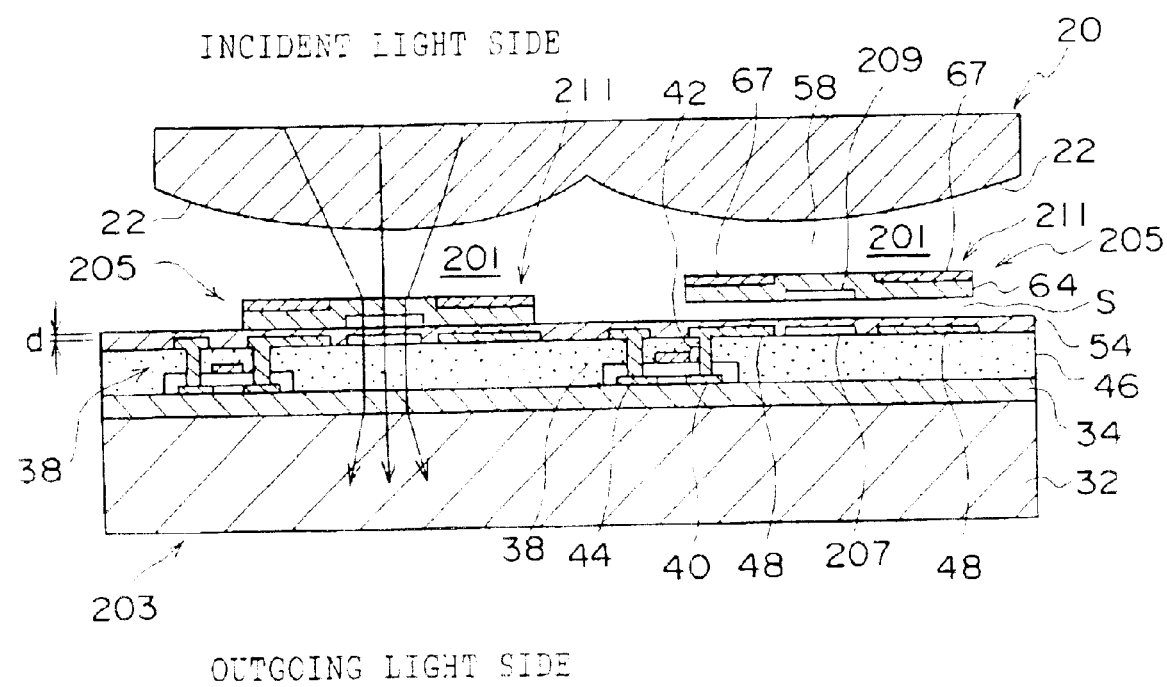
FIG. 17 is a partially expanded sectional side view of the transmission two-dimensional light modulating device shown in FIG. 16.
Figure 18:
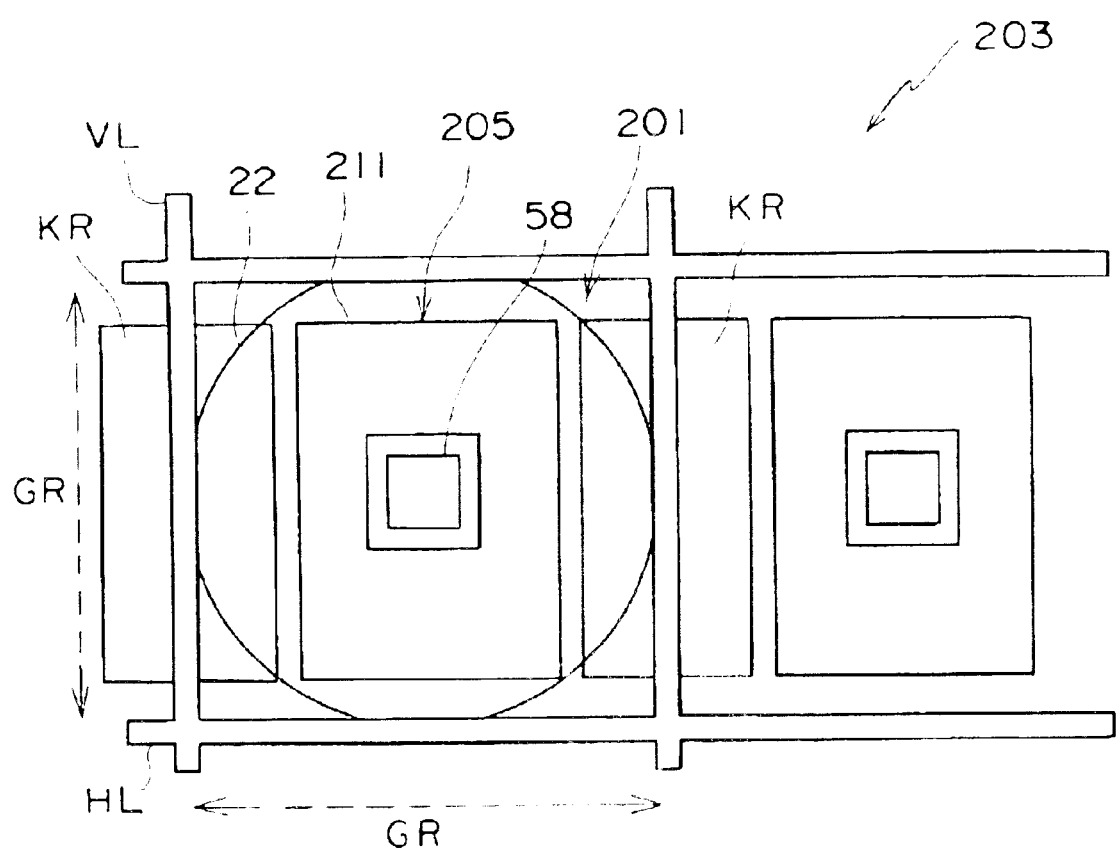
FIG. 18 is a partially expanded plan view of FIG. 17.
Figure 19:
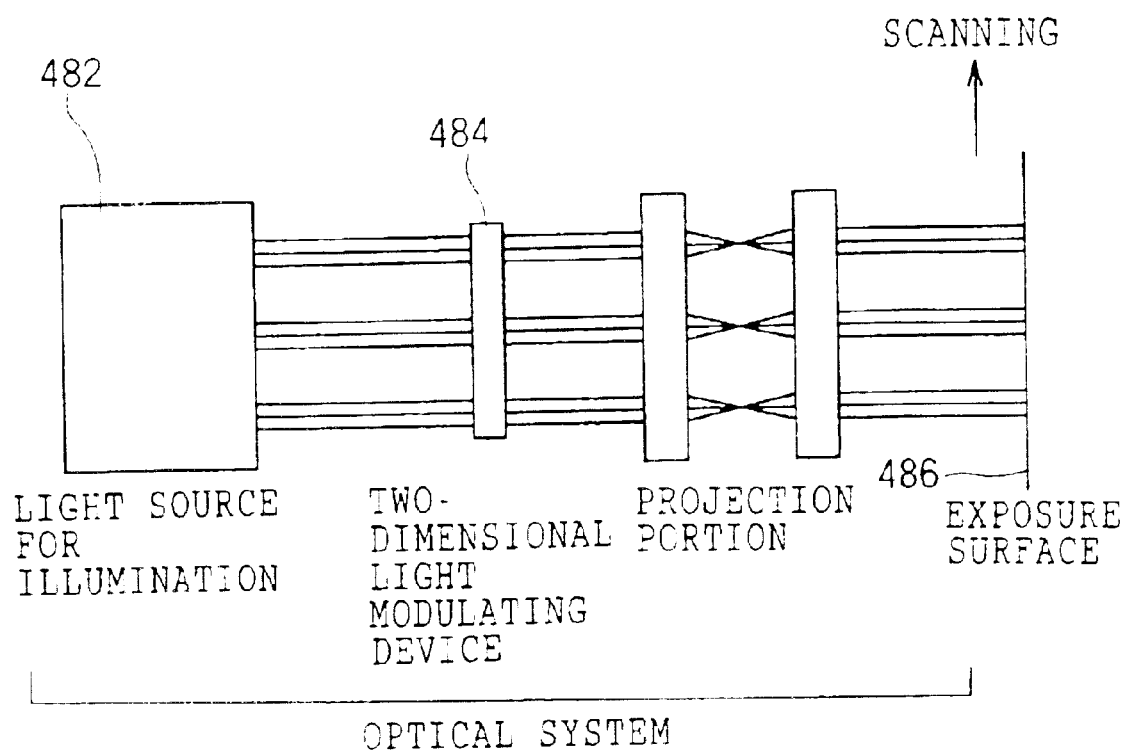
FIG. 19 is a block diagram showing the exposure apparatus of the related art.
Figure 20A:
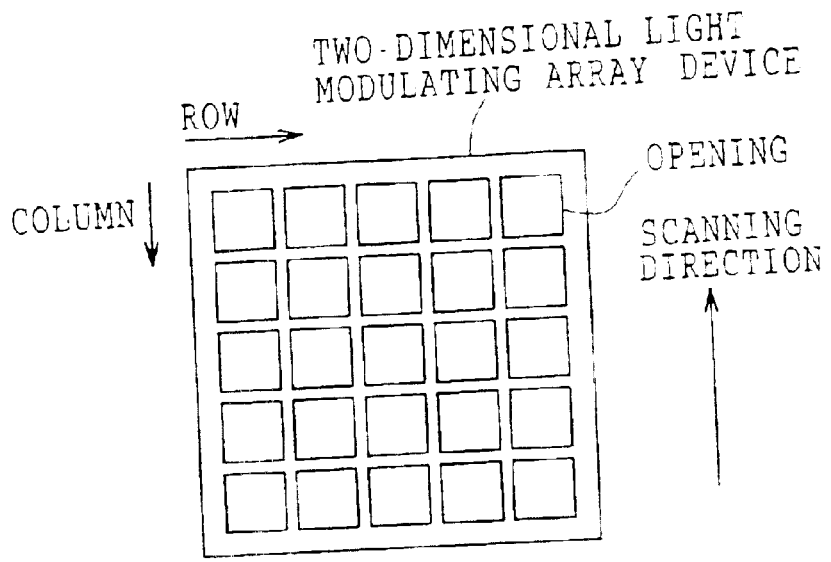
FIGS. 20A and 20B are front views showing the locus of the scanning light beam in the case that the light modulating device is arranged so that a column direction of each light modulating element is parallel to the scanning direction, and the locus of the scanning light beam in the case that the light modulating device is arranged so that the column direction of each light modulating element is oblique to the scanning direction in the related art respectively (example when the resolution is low).
Figure 20B:
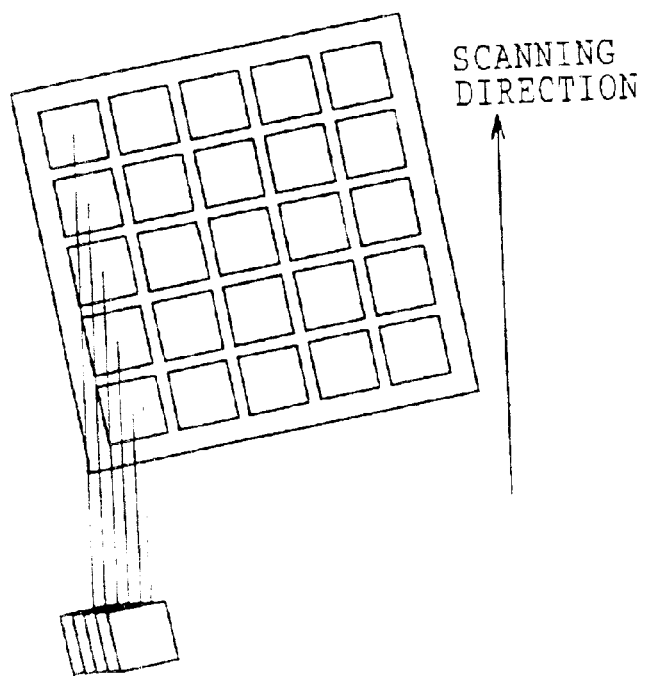
Figure 21A:
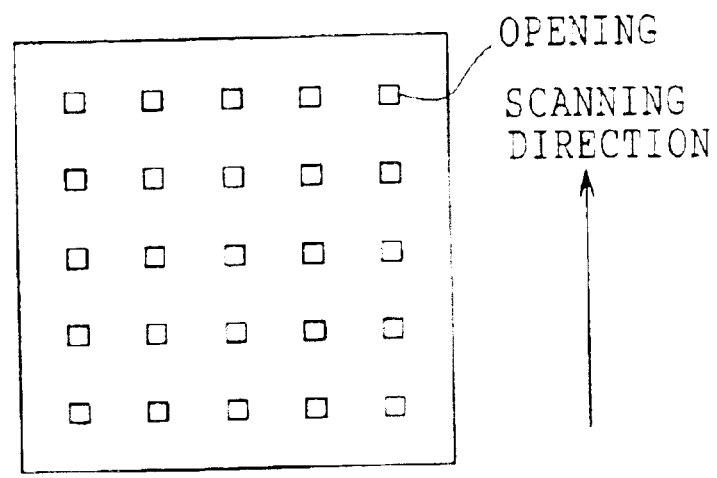
FIGS. 21A and 21B are front views showing the locus of the scanning light beam in the case that the light modulating element is arranged so that a column direction of each light modulating element is parallel to the scanning direction, and the locus of the scanning light beam in the case that the light modulating element is arranged so that the column direction of each light modulating element is oblique to the scanning direction in the related art respectively (example when the resolution is high).
Figure 21B:
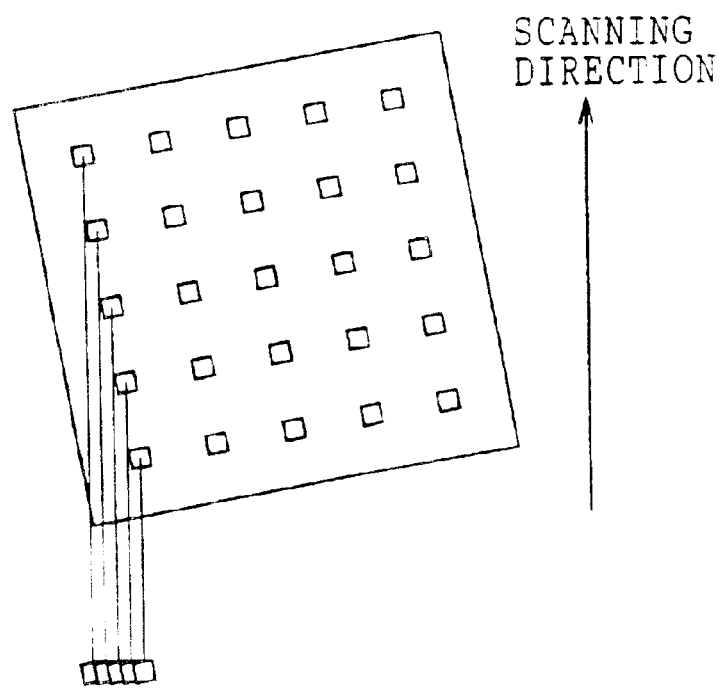
Figure 22:
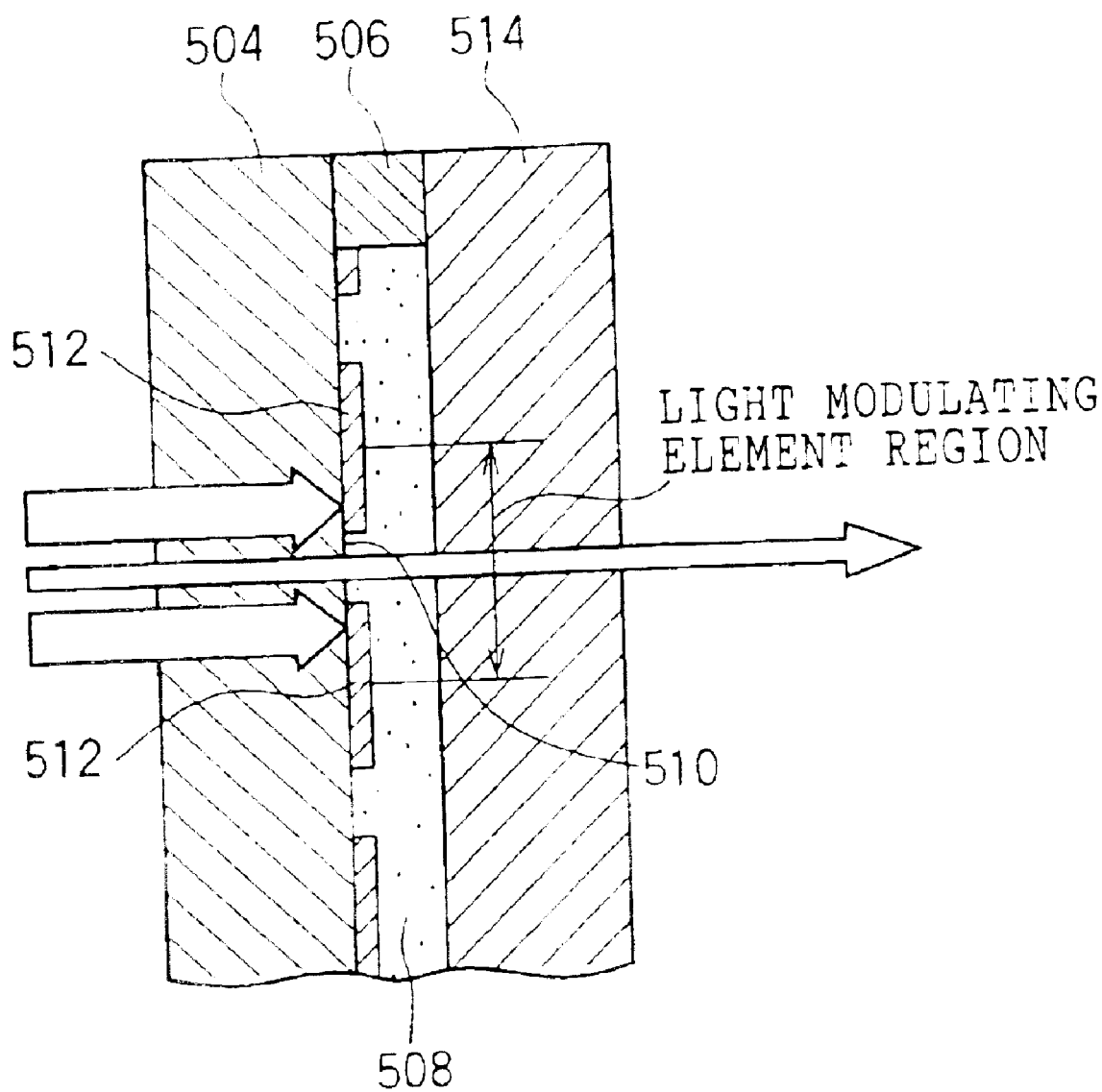
FIG. 22 is a partially expanded sectional side view showing a structure of the light modulating device of the exposure apparatus of the related art.

A third embodiment will be described below. FIG. 15 is a block diagram showing the whole exposure apparatus of a third embodiment, FIG. 16 is a sectional view of a transmission two-dimensional light modulating device built in the exposure apparatus of the third embodiment, FIG. 17 is a partially expanded sectional side view of the transmission two-dimensional light modulating device shown in FIG. 16, and FIG. 18 is a partially expanded plan view of FIG. 17. In the third embodiment, the same components as those of the second embodiment are indicated by the same reference numerals and the description is omitted.

As shown in FIG. 15, a transmission two-dimensional light modulating device 201 is built in an exposure apparatus 200 described in the third embodiment. The transmission two-dimensional light modulating device 201 includes the two-dimensional light modulating device 203 in which micro electro-mechanical light modulating elements are two-dimensionally arrayed, and an MLA 20 which is integrally formed to the two-dimensional light modulating device 203.

As shown in FIG. 16, in the exposure apparatus described in the third embodiment, whereby the plurality of light modulating elements 205 are two-dimensionally arrayed, the two-dimensional light modulating device 203 is reconstructed and MLA 20 is provided across the light modulating element 205 on the side opposite to a transparent glass substrate 32 which is an element fixing substrate. MLA 20 is formed on a transparent substrate 215 different from the transparent glass substrate 32 which is the element fixing substrate of the two-dimensional light modulating device 203. Each of the substrates 32 and 215 is bonded to form integrally.

As shown in FIG. 17, an opening 58 which transmits an almost proportion of the condensed light and a metal film 48 which is a driving electrode provided in at least a part of a region except the opening 58 are provided in each light modulating element of the two-dimensional light modulating device 203.

The exposure apparatus 200 also has a projection portion 6 in which the plane-shaped light beam from a light source 12 is incident to the two-dimensional light modulating device 203 and the transmitted light modulated with the two-dimensional light modulating device 203 is projected to perform the exposure. The projection light of the projection portion 6 is projected while the projection light is relatively being moved in a scanning direction for an object to be exposed, and a column of the two-dimensional light modulating device 203 is arranged to be oblique relative to the scanning direction.

As described above, MLA 20 corresponding to each light modulating element is provided on the incident side of the two-dimensional light modulating device 203, the incident light from the light source 12 is condensed onto the region whose area is smaller than that of the light modulating element and guided to the light modulating element 205 which is the electro-mechanical element.

In relation to the transmission two-dimensional light modulating device 201, MLA 20 in which microlenses 22 are two-dimensionally arrayed is integrally formed on the light-incident side of the two-dimensional light modulating device 203. However, in the embodiment, since the MLA 20 is arranged across the light modulating element 205 on the side opposite to the transparent glass substrate 32, unlike the case of the two-dimensional light modulating device 24 described in the second embodiment, the light beam is incident from the side of the microlens 22, the light modulating element 205 transmits the incident light, and then the light is transmitted to the side of the transparent glass substrate 32 which is the element fixing substrate.

The transmission two-dimensional light modulating device 201 includes the transparent glass substrate 32 and a base insulating film 34. A general MOSFET 38 is formed on the light-incident side of the base insulating film 34, and the two-dimensional light modulating device 203 has a structure of a so-called active matrix type.

MOSFET 38 is covered with a transparent first insulating film 46. An electrically conductive metal film 48 is formed on the light-incident side of the first insulating film 46, and the metal film 48 becomes an electrode which drives the two-dimensional light modulating device 203. The metal film 48 and a drain 40 of MOSFET 38 are electrically connected by a connecting plug 42. The light-incident side of the metal film 48 is covered with a transparent second insulating film 54.

The opening 58 is formed in the center of the metal film 48 while a dimension of the opening 58 is smaller than a pitch of a light modulating element (it is often in the range of 10 $\mu$m to 30 $\mu$m), the light beam condensed with MLA 20 is formed to pass through the opening 58, and the opening 58 also has a function as an aperture.

As shown in FIG. 18, in the two-dimensional light modulating device 203, a column lead VL and a row lead HL are pattern-formed in the form of a lattice and MOSFET 38 is formed in a light-modulating-element circuit region KR. The active driven type of two-dimensional matrix is formed in such a manner that the row lead HL is connected to a gate of MOSFET 38 and the column lead VL is connected to a source 44 of MOSFET 38. A square region surrounded by the column lead VL and row lead HL becomes a light-modulating-element region GR in which the opening 58 is located in the center.

The light-modulating-element circuit is not limited to the above-described example, for example it may be an SRAM circuit constructed by CMOS. Further, the light-modulating-element circuit region KR and arrangement, a size, and a shape of the opening 58 are not limited to the above-described examples.

As shown in FIG. 17, a third insulating film 64 is provided on the light-incident side of the second insulating film 54 so that a gap-shaped space S is formed at a predetermined distance d. The distance d between the second insulating film 54 and the third insulating film 64 is often set to a quarter of a wavelength of a laser beam which is irradiated from the light-incident side.

Further, an opaque metal film 67 is formed in a region except for the opening 58 on the light-incident side of the third insulating film 64, and attracting force between the metal films 67 and 48 is adjusted by adjusting applied voltage between the metal films 48 and 67. Consequently, the distance d can be adjusted, and the two-dimensional light modulating device 203 has a so-called etalon structure.

One half-mirror 207 is provided in the second insulating film 54, and the other half-mirror 209 is provided in the third insulating film 64, and the gap-shaped space S is formed between the half-mirrors 207 and 209 at the predetermined distance d. The half-mirrors 207 and 209 may be one in which the second and third insulating films 54 and 64 function as a half-mirror layer. Similarly to the second and third insulating films 54 and 64, the half-mirrors 207 and 209 are the multi-layered films made of the high-refractive index material and the low-refractive index material. The third insulating film 64, the metal film 67, and the half-mirror 209 constitute a movable thin film 211.

A supporting portion (not shown, substantially similar to the supporting portion 65 shown in FIG. 6) is formed between the third insulating film 64 and the second insulating film 54. The supporting portion supports the movable thin film 211 so that the movable thin film 211 can be freely close to or apart from the second insulating film 54 when the distance d is changed by the voltage applied between the metal films 48 and 67 or the application of the voltage is released.

In MLA 20 of the embodiment, a shielding film 216 shown in FIG. 16 is provided between the microlenses 22 adjacent to each other. The shielding film 216 shields the unnecessary light caused by such as scattering and diffraction of the light passing through between the microlenses 22. It is possible to form the structure in which the shielding film 216 is provided only at the back (light-incident side) of the light-modulating-element circuit region KR and electrical malfunction caused by the light incident to the light-modulating-element circuit is prevented. In order to shield the unnecessary light except the effective light passing through the opening 58, it is also possible to provide the shielding film 216 at a preferable position. Though the materials such as an absorber and reflector can be used as the shielding film 216, it is more preferable that the reflector is used. By reflecting the incident light with the shielding film 216, heat generation caused by light absorption can be prevented and performance and reliability are improved. In particular, it is effective when the exposure is performed with the high-output light source.

[Manufacturing Method of Transmission Two-dimensional Light Modulating Device]

A manufacturing method of the two-dimensional light modulating device 203 can adopt the same way as the case of the two-dimensional light modulating device 24 of the second embodiment. That is to say, MOSFET 38 is formed on the light-incident side of the transparent glass substrate 32, by using SOI in which the base insulating film 34 and a crystalline silicon layer are provided on the glass substrate 32. The first insulating film 46 is formed, the connecting plug 42 and metal film 48 are formed, and then the opening 58 is formed.

The second insulating film 54 is formed, a resist film having a thickness corresponding to the distance d is applied, and the third insulating film 64 and the metal film 67 are formed in order. Similarly to the case of the light modulating device 24, the space S is formed by removing the resist film by etching with organic solvent or oxygen plasma etching.

Unlike the case of the two-dimensional light modulating device 24, in MLA 20, a glass substrate 215 for forming MLA is provided in such a manner that a space 213 (see FIG. 16) providing at least displacement space for the movable thin film 211 is formed on the second insulating film 54. In the glass substrate 215, the resist layer is formed on the outgoing-light side corresponding to the shape of MLA 20 and reactive ion etching is performed from the light-incident side. As a result, the transparent glass substrate 215 is etched according to the thickness of the resist layer to form MLA 20.

The glass substrate 215 is supported and fixed to the side of the second insulating film 54 with a peripheral wall 217. Accordingly, the space 213 between the glass substrate 215 and the second insulating film 54 becomes the closed space.

Operation of the exposure apparatus 200 including the transmission two-dimensional light modulating device 201 will be described below.

When the laser beam having a predetermined wavelength is emitted from a light source for illumination 12, the laser beam which has reached the transmission two-dimensional light modulating device 201 is condensed with each microlens 22 of MLA 20 and passes through the opening 58.

The laser beam passes through the third insulating film 64, leaves from the half-mirror 209, and reaches the half-mirror 207. At this point, transmission and shielding (non-transmission) of the laser beam can be switched at high speed in such a manner that the distance d is changed by adjusting the voltage applied between the metal films 48 and 67.

In the light modulating element 205, the displacement of the movable thin film 211 changes the distance between the half-mirrors 207 and 209, and the light is transmitted or reflected by changing strength of a synthesized wave repeatedly reflected between parallel mirrors. That is to say, the light modulation is performed by adopting Fabry-Perot interference. In the Fabry-Perot interference in which the reflection and the transmission are repeated between the parallel mirrors, the light modulating element 205 transmits the light having the wavelength of substantial integer multiples of the distance d.

Accordingly, when the laser beam which has passed through the two-dimensional light modulating device 203 scans the scanning surface, the transmission and the shielding of the scanning light can be switched at high speed and a fine exposure image can be obtained at high speed.

As described above, in the third embodiment, the exposure apparatus 200 has the transmission two-dimensional light modulating device 201 including the two-dimensional light modulating device 203 in which the light modulating elements 205 are two-dimensionally arrayed and MLA 20 which is integrally formed to the two-dimensional light modulating device 203.

Consequently, displacement of MLA 20 is not generated in the operation of the exposure apparatus 200, so that frequency of trouble caused in the operation of the exposure apparatus 200 can be largely decreased. The space providing MLA 20 is remarkably decreased, which contributes to miniaturization of the exposure apparatus 200.

Accuracy of relative position between MLA 20 and the two-dimensional light modulating device 203 is improved, so that incident light can be effectively condensed to the light modulating element 205 and the usability of the light can be improved. The accuracy of relative position between MLA 20 and the two-dimensional light modulating device 203 is improved, so that the area of the condensed light can be further reduced without decreasing the usability of the light and the resolution on the exposure surface can be increased.

Further, in the two-dimensional light modulating device 203, since MLA 20 is supported and fixed to the side of the second insulating film 54 with the peripheral wall 217, the space 213 between the glass substrate 215 and the second insulating film 54 becomes the closed space, which allows MLA 20 to be also used as a sealing material for sealing the transmission two-dimensional light modulating device 201. Accordingly, a compact sealing structure can be realized, compared with the case using other materials.

Since the space 213 between the glass substrate 215 and the second insulating film 54 becomes the closed space, it is possible to encapsulate inert gas into the space 213. Accordingly, dust resistant performance of the transmission two-dimensional light modulating device 201 can be improved, degradation caused by oxidation and the like can be prevented, and operational reliability and durability of the light modulating element 205 can be improved.

As described above, the embodiments were described, however, the above-described embodiments are the example and the various modifications can be made without departing from the spirit and the scope of the invention. Needless to say, the scope of the invention is not limited to the above-described embodiments.

In the transmission two-dimensional light modulating device according to the aspect of the invention includes a plurality of light modulating elements modulating the light that is incident thereto and emitting the light, wherein each of the light modulating elements is formed from a micro electronic machinery which is two-dimensionally arranged, and the transmittance can be controlled so as to vary for each of the light modulating elements; and the light modulating device further comprises a lens array on a light-incident side of the light modulating elements, and the lens array condenses the incident light, which impinges on each of the light modulating elements, into a region whose area is smaller than an area occupied by each of the light modulating elements at a light-incident side thereof.

Due to the above-described structure of the aspect of the invention, condensing effect of the lens array improves the usability of the light and the resolution is improved in the projection exposure by forming the substantial light-modulating-element size smaller than the light-modulating-element region. By using the micro electro-mechanical transmission two-dimensional light modulating device, the high-speed response can be achieved, two-dimensionability can be easily realized, the low-voltage drive can be realized, the optical system can be simplified, and low-cost can be achieved. Further, since the micro electro-mechanical transmission two-dimensional light modulating device is used, selection of the material can correspond to the light source of the wide range from the UV light to the infrared light.

When the above-described two-dimensional light modulating device is an active-matrix-type device having an active element in each light modulating element, even in the case of the light modulating method having no memory characteristic, the two-dimensional light modulating device can be easily driven. Further the gradation scale can be easily controlled in analog.

The two-dimensional light modulating device may be an active-matrix-type device having an active element in each light modulating element and the active element may be arranged on the outgoing-light side of the two-dimensional light modulating device. Accordingly, electrical malfunction caused by the unnecessary light incident to the active element from the light-incident side can be prevented in the active element.

The lens array may include at least two lens arrays on the incident side of the two-dimensional light modulating device. Accordingly, each lens array can be used in optically functional separation and it becomes practical. For example, by using the plurality of lens arrays, a curvature radius of each lens array can be enlarged in order to obtain the same focal point, and the cost reduction can be archived in manufacturing the lens array.

In the transmission two-dimensional light modulating device according to the aspect of the invention, the lens array may be integrally formed with the two-dimensional light modulating device on the substrate which supports the two-dimensional light modulating device.

As described above, by integrally forming the lens array with the two-dimensional light modulating device on the same substrate, the alignment of the lens array and the two-dimensional light modulating device is not required, and the tolerances of the optical accuracy of the lens array and the dimensional accuracy of the pattern of the two-dimensional light modulating device are increased, so that the cost reduction can be achieved. Since the relatively positional accuracy between the lens array and the two-dimensional light modulating device is improved, the incident light can be efficiently condensed in the two-dimensional light modulating device and the usability of the light can be improved. Further, since the relatively positional accuracy between the lens array and the two-dimensional light modulating device is improved, the condensing area can be decreased without decreasing the usability of the light and the resolution can be increased on the exposure surface.

In the transmission two-dimensional light modulating device according to the aspect of the invention, the lens array may be provided on the substrate different from the substrate supporting the two-dimensional light modulating device and each substrate may be bonded to form the integral structure.

By bonding the lens array to the two-dimensional light modulating device to form the integral structure, positioning adjustment between the lens array and the two-dimensional light modulating device is facilitated and tolerance of optical accuracy of the lens array and the tolerance of pattern dimension accuracy of the two-dimensional light modulating device are increased, and the low-cost is achieved. Since the accuracy of the relative position between the both is improved, incident light can be effectively condensed to the light modulating element and the usability of the light can be improved. The accuracy of relative position of them is improved, the area of the condensed light can be further reduced without decreasing the usability of the light and the resolution on the exposure surface can be increased. Further, the lens array and the two-dimensional light modulating device are formed on the different substrates and each substrate is integrally bonded, so that each substrate can be made independently. Accordingly, the lens array is finally bonded, so that the process can be simplified and yield of the two-dimensional light modulating device can be improved.

In the transmission two-dimensional light modulating device according to the aspect of the invention, the two-dimensional light modulating device may include the opening which transmits the condensed light from the lens array, and the shielding portion which cuts off the light from the lens array for each of the light modulating elements and is provided in at least a part of the region except the opening.

As described above, by providing the shielding portion in at least a part of the region except the opening, it can be prevented that the unnecessary light occurs in the case in which the accuracy of the lens array is not largely increased and the unnecessary light caused by diffraction and scattering of the lens array reaches the exposure surface.

The shielding portion may shield the light by reflecting the incident light. Accordingly, heat generation caused by light absorption can be prevented and performance and reliability are improved. In particular, it is effective when the exposure is performed with the high-output light source.

In the exposure apparatus according to the aspect of the invention, the two-dimensional light modulating device may include the movable portion and the movable portion may be displaced to change the transmittance of the incident light to modulate the light by changing the aperture area which transmits the incident light.

As described above, by using this type of micro electro-mechanical light modulating element, the high-speed light modulation can be performed with high resolution. Further, the light of the wide wavelength ranging from the UV light to the IR light can be modulated, depending on the selection of the material constituting the element. Particularly in the case of application to the exposure apparatus for performing on-demand direct photolithography, though it is necessary to perform the high-speed exposure with the ultraviolet ray, it is possible in a manner that uses the micro electro-mechanical light modulating element for the two-dimensional light modulating device.

For example, the micro electro-mechanical light modulating element has the movable portion which can be displaced and at least one portion of it is supported, and the movable portion is displaced by electrostatic force to change the transmittance of the incident light. The light modulation can be performed with low voltage and low electrical power consumption in such a manner that the movable portion is displaced by the electrostatic force to change the transmittance of the incident light. The cost reduction can be achieved because the element is easily manufactured.

Further, the micro electro-mechanical light modulating element may include the substrate having the movable portion which can be displaced and at least one portion of it is supported by the substrate, and the movable portion may be displaced substantially parallel to the substrate to change the transmittance of the incident light. The amount of displacement can be increased and the more dynamic light modulation can be performed in such a manner that the movable portion is displaced substantially parallel to the substrate to change the transmittance of the incident light.

In this case, the micro electro-mechanical light modulating element may change the transmittance of the incident light with the mechanical optical shutter. When the transmittance of the incident light is changed with the mechanical optical shutter, leakage transmitted light during cutting off the light can be eliminated or lessened as little as possible, which realizes a remarkably high contrast during light modulation.

The light modulating device may have a movable portion and changes transmittance of the incident light to modulate the light by at least an optical effect including interference, refraction, diffraction, or deflection of the light which are caused by displacement of the movable portion.

The micro electro-mechanical light modulating element may include the substrate having the movable portion which can be displaced and at least one portion of it is supported by the substrate, and the movable portion may be displaced in the direction substantially perpendicular to the substrate to change the transmittance of the incident light. The light modulation can be performed with the simpler structure and the cost reduction can be achieved by the light modulation performed by changing the transmittance of the incident light by displacing the movable portion in the direction substantially perpendicular to the substrate. A numerical aperture can be increased, so that the higher-speed light modulation can be performed by decreasing the amount of displacement.

The micro electro-mechanical light modulating element may modulate the incident light by the light interference effect. In the case that the incident light, which is the substantially parallel light having the narrow wavelength width like the laser beam, is modulated by adopting the light modulation in which the transmittance of the incident light is changed by the light interference, the light modulation with simpler structure and the cost reduction is achieved. The incident light can be reflected with high reflectivity during cutting off the light, the heat generation caused by the light absorption can be prevented, and the performance and the reliability are improved. In particular it is effective when the exposure is performed with the high-output light source. Further, the high transmittance can be obtained during the transmission, and the usability of the light can be increased while the contrast can be increased.

Further, the incident light may be the substantially parallel light. Accordingly, many optical principles such as interference effect, diffraction effect, refraction, and reflection can be utilized as the light modulating method, so that the performance, particularly the usability of the light and the contrast can be improved.

In this case, the first lens array may condense the plane-shaped incident light, the second lens array may convert the light to the substantially parallel light, and then the light may be incident to the two-dimensional light modulating device. Accordingly, deterioration of the performance caused by incident angle dependence can be prevented for the light modulating element having the incident angle dependence, for example the light modulating element utilizing the interference, the diffraction, or the like in the liquid crystal element or the micro electro-mechanical light modulating element.

The exposure apparatus according to the second aspect of the invention includes a light source which emits light; an object to be exposed, which is relatively moved in a predetermined direction with respect to the light source; and an optical system which projects the light from the light source onto the object to be exposed, the optical system comprising a light modulating device, wherein the light modulating device comprises a plurality of light modulating elements modulating the light incident thereto and emitting the light, each of the light modulating elements is formed from a micro electronic machinery, which is two-dimensionally arranged, and transmittance can be controlled so as to vary for each of the light modulating elements, the light modulating device further comprises a lens array on a light-incident side of the light modulating elements and the lens array condenses the incident light, which impinges on each of the light modulating elements at a light-incident side thereof, into a region whose area is smaller than the area occupied by each of the light modulating elements, wherein projection light of the optical system is projected while being relatively moved in a scanning direction with respect to an object to be exposed, and a column of the light modulating device is arranged to be oblique relative to the scanning direction.

In an aspect of the invention, when the light from the light source is projected on the object to be exposed, the transmitted light may be moved without moving the object to be exposed, or the object to be exposed may be moved without moving the transmitted light. That is to say, as long as the projection light and the object to be exposed relatively move in the predetermined direction, the good projection can be performed.

The optical system may include the projection portion which expands and projects the light transmitted through the two-dimensional light modulating device onto the object to be exposed. This allows the exposure area to be enlarged and total exposure time to be reduced.

The effect, in which the resolution in the direction perpendicular to the scanning direction on the exposure surface is substantially increased by the light-modulating-element pitch in the column direction and the oblique angle when the column of the two-dimensional light modulating device is arranged to be oblique to the scanning direction, and the effect in which the usability of the incident light is improved, are obtained in such a manner that the lens array corresponding to each light-modulating-element region is provided on the light-incident side of the two-dimensional light modulating device, the light from the light source is condensed to the region whose area is smaller than the area occupied by the light-modulating-element region, and the light is guided to the light modulating element.

The exposure apparatus according to the aspect of the invention includes a light source which emits light, an object to be exposed, which is relatively moved in a predetermined direction to the light source, and an optical system which projects the light from the light source onto the object to be exposed, wherein the optical system includes the two-dimensional light modulating device which has a plurality of light modulating elements modulating the incident light, is provided on an optical path from the light source toward the object to be exposed so that the light from the light source is substantially uniformly incident to the plurality of light modulating elements, and modulates the incident light in each of the plurality of light modulating elements to output the light, a direction in which the plurality of light modulating elements are arrayed is oblique to the predetermined direction, and a lens array which includes the lens array arranged on an light-incident side of the two-dimensional light modulating device according to the plurality of light modulating elements, and condenses the light from the light source into a region where an area is smaller than the region occupied by the light modulating element to impinge on each light modulating element.

What is claimed is:

1. A light modulating device according comprising:
   a plurality of light modulating elements modulating the light that is incident thereto and emitting the light, wherein:
   each of the light modulating elements is formed from a micro electronic machinery which is two-dimensionally arranged, and transmittance of said light modulating elements can be controlled so as to vary for each of the light modulating elements; and
   the light modulating device further includes a lens array disposed towards a light-incident side of the light modulating elements, and the lens array condenses the incident light, which impinges on each of the light modulating elements, into a region whose area is smaller than an area occupied by each of the light modulating elements at a light-incident side thereof, wherein the light modulating device has a movable portion and changes transmittance of the incident light to modulate the light by changing an area of the opening transmitting the incident light, due to displacement of the movable portion.

2. A light modulating device according comprising:
   a plurality of light modulating elements modulating the light that is incident thereto and emitting the light, wherein:
   each of the light modulating elements is formed from a micro electronic machinery which is two-dimensionally arranged, and transmittance of said light modulating elements can be controlled so as to vary for each of the light modulating elements; and
   the light modulating device further includes a lens array disposed towards a light-incident side of the light modulating elements, and the lens array condenses the incident light, which impinges on each of the light modulating elements, into a region whose area is smaller than an area occupied by each of the light modulating elements at a light-incident side thereof, wherein the light modulating device has a movable portion and changes transmittance of the incident light to modulate the light by at least an optical effect including interference, refraction, diffraction, or deflection of the light which are caused by displacement of the movable portion.

3. An exposure apparatus comprising:
   a light source which emits light;
   an object to be exposed, which is relatively moved in a predetermined direction with respect to the light source; and
   an optical system which projects the light from the light source onto the object to be exposed, the optical system comprising a light modulating device, wherein
   the light modulating device includes a plurality of light modulating elements modulating the light incident thereto and emitting the light,
   each of the light modulating elements is formed from a micro electronic machinery, which is two-dimensionally arranged, and transmittance can be controlled so as to vary for each of the light modulating elements,
   the light modulating device further includes a lens array disposed towards a light-incident side of the light modulating elements and the lens array condenses the incident light, which impinges on each of the light modulating elements at a light-incident side thereof, into a region whose area is smaller than the area occupied by each of the light modulating elements, wherein
   projection light of the optical system is projected while being relatively moved in a scanning direction with respect to an object to be exposed, and
   a column of the light modulating device is arranged to be oblique relative to the scanning direction.

4. An exposure apparatus comprising:
   a light source which emits light;
   an object to be exposed, which is relatively moved in a predetermined direction with respect to the light source; and
   an optical system which projects the light from the light source onto the object to be exposed, wherein
   the optical system includes a two-dimensional light modulating device which has a plurality of light modulating elements modulating the light incident thereto, is provided on an optical path from the light source toward the object to be exposed, and modulates the incident light for each of the plurality of light modulating elements to output the light, a direction in which the plurality of light modulating elements are arrayed being oblique to the predetermined direction, and
   a lens array which is arranged towards a light-incident side of the two-dimensional light modulating device so as to correspond to the plurality of light modulating elements condenses the light from the light source into a region whose area is smaller than an area occupied by the light modulating element and causes the light to impinge on each of the light modulating elements.

5. An exposure apparatus according to claim 4, wherein the light modulating elements are arrayed so as to form a matrix in two directions that are different from each other, and, in at least two rows that cross the predetermined direction at substantially right angles, light modulating elements located in a back row with respect to the predetermined direction are arranged between light modulating elements located in a front row as seen from the predetermined direction.

6. An exposure apparatus according to claim 4, wherein the two-dimensional light modulating device comprises micro electro-mechanical light modulating elements.

7. An exposure apparatus according to claim 4, wherein, in the two-dimensional light modulating device, the light modulating elements separately have active elements, and the active elements separately control modulating operation of the incident light of the light modulating elements.

8. An exposure apparatus according to claim 7, wherein the active elements are arranged on an outgoing-light side of the two-dimensional light modulating device.

9. An exposure apparatus according to claim 4, wherein the lens array comprises a first lens array and a second lens array, the first lens array condenses the light from the light source, the second lens array further condenses the light, and then the light is incident to the two-dimensional light modulating device.

10. An exposure apparatus according to claim 4, wherein the lens array comprises a first lens array and a second lens array, the first lens array condenses the light from the light source, the second lens array converts the light to substantially parallel light, and then the light is incident to the two-dimensional light modulating device.

11. An exposure apparatus according to claim 4, herein the lens array is integrally formed with the two-dimensional light modulating device.

12. An exposure apparatus according to claim 11, wherein the lens array is connected to the two-dimensional light modulating device.

13. An exposure apparatus according to claim 4, wherein the two-dimensional light modulating device comprises openings which transmit the light from the lens array and have a smaller area than that of each light modulating element, and a shielding portion which cuts off the light from the lens array and is provided in at least a part of the region other than the opening.

14. An exposure apparatus according to claim 12, wherein the shielding portion cuts the light by reflecting the incident light.

15. An exposure apparatus according to claim 6, wherein the micro electro-mechanical light modulating device has a movable portion which can be displaced, and the movable portion is displaced to modulate the incident light.

16. An exposure apparatus according to claim 15, wherein the movable portion is displaced by electrostatic force to modulate the incident light.

17. An exposure apparatus according to claim 15, wherein the two-dimensional light modulating device comprises a substrate having a movable portion provided thereon, and the movable portion is displaced substantially parallel to the substrate to modulate the incident light.

18. An exposure apparatus according to claim 15, wherein the two-dimensional light modulating device comprises a substrate having the movable portion provided thereon, and the movable portion is displaced substantially perpendicular to the substrate to modulate the incident light.

19. An exposure apparatus according to claim 15, wherein the two-dimensional light modulating device comprises a substrate having the movable portion provided thereon, and at least one portion of the movable portion is supported by the substrate.

20. An exposure apparatus according to claim 6, wherein the micro electro-mechanical light modulating element comprises a mechanical optical shutter and the incident light is modulated thereby.

21. An exposure apparatus according to claim 6, wherein the micro electro-mechanical light modulating element modulates the incident light by at least an optical effect including in refraction, diffraction, or deflection of the light.

22. An exposure apparatus according to claim 4, wherein the light from the light source that is incident to the plurality of light modulating elements is substantially parallel light.

23. An exposure apparatus according to claim 4, wherein the optical system comprises a projection portion which expands and projects the light transmitted by the two-dimensional light modulating device onto the object to be exposed.

* * * * *